United States Patent
Shimizu et al.

(10) Patent No.: US 10,795,248 B2
(45) Date of Patent: Oct. 6, 2020

(54) LIGHT SOURCE DEVICE AND PROJECTOR

(71) Applicant: SEIKO EPSON CORPORATION, Tokyo (JP)

(72) Inventors: Tetsuo Shimizu, Matsumoto (JP); Akira Egawa, Shiojiri (JP); Hidemitsu Sorimachi, Matsumoto (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 16/390,123

(22) Filed: Apr. 22, 2019

(65) Prior Publication Data
US 2019/0324359 A1    Oct. 24, 2019

(30) Foreign Application Priority Data
Apr. 23, 2018  (JP) ................. 2018-082632

(51) Int. Cl.
*G03B 21/20*    (2006.01)
*G03B 21/14*    (2006.01)
*H01S 5/022*    (2006.01)

(52) U.S. Cl.
CPC ....... *G03B 21/2006* (2013.01); *G03B 21/145* (2013.01); *H01S 5/0222* (2013.01); *H01S 5/02208* (2013.01); *H01S 5/02228* (2013.01)

(58) Field of Classification Search
CPC .... G03B 21/006; G03B 21/20; G03B 21/145; G03B 21/208; G03B 21/2013; G03B 21/2033; G03B 21/2066; H01S 5/022; H01S 5/0226; H01S 5/02292; H01S 5/02296; H01S 5/02228; H01S 5/02288; H01S 5/02208
See application file for complete search history.

(56) References Cited

U.S. PATENT DOCUMENTS

| | | | |
|---|---|---|---|
| 8,702,241 B2 | 4/2014 | Ohsugi |
| 9,261,252 B2 | 2/2016 | Oh et al. |
| 10,267,483 B2 | 4/2019 | Kiyota et al. |
| 10,439,358 B2 | 10/2019 | Miura et al. |
| 10,510,930 B2 | 12/2019 | Namie |

(Continued)

FOREIGN PATENT DOCUMENTS

| | | |
|---|---|---|
| JP | 2011-082455 A | 4/2011 |
| JP | 2012-514347 A | 6/2012 |

(Continued)

*Primary Examiner* — Sultan Chowdhury
(74) *Attorney, Agent, or Firm* — Oliff PLC

(57) ABSTRACT

A light source device according to the present disclosure includes a substrate having a first surface, a plurality of light emitting elements disposed on the first surface side of the substrate, a frame body which is disposed so as to surround the plurality of light emitting elements, and which is bonded on the first surface side of the substrate, and a lid body which has a light transmissive member configured to transmit light emitted from the plurality of light emitting elements, which is disposed so as to be opposed to the first surface of the substrate, and which is bonded on an opposite side of the frame body to the substrate. The plurality of light emitting elements is housed in a housing space, the housing space being formed by the substrate, the frame body and the lid body. The frame body is formed of a material including a nonconductive material.

17 Claims, 16 Drawing Sheets

(56) References Cited

U.S. PATENT DOCUMENTS

| | | | |
|---|---|---|---|
| 2005/0094937 A1 | 5/2005 | Sato et al. | |
| 2009/0290346 A1* | 11/2009 | Ogawa | F21K 9/00 |
| | | | 362/249.01 |
| 2010/0164346 A1 | 7/2010 | Li et al. | |
| 2012/0327377 A1 | 12/2012 | Ohsugi | |
| 2013/0057834 A1 | 3/2013 | Yoshida | |
| 2013/0152366 A1* | 6/2013 | Hiroi | B41J 2/473 |
| | | | 29/428 |
| 2014/0021495 A1 | 1/2014 | Li et al. | |
| 2014/0254016 A1* | 9/2014 | Egawa | G02B 27/0006 |
| | | | 359/513 |
| 2015/0103856 A1 | 4/2015 | Hagino et al. | |
| 2015/0270682 A1 | 9/2015 | Daniels et al. | |
| 2016/0341395 A1 | 11/2016 | Kiyota et al. | |
| 2016/0349604 A1 | 12/2016 | Okuno | |
| 2017/0038505 A1 | 2/2017 | Chern et al. | |
| 2017/0219918 A1 | 8/2017 | Miyasaka | |
| 2017/0317467 A1 | 11/2017 | Miura et al. | |
| 2017/0336703 A1 | 11/2017 | Takagi | |
| 2017/0338628 A1 | 11/2017 | Matsushita et al. | |
| 2018/0119898 A1 | 5/2018 | Fujitani et al. | |
| 2018/0254604 A1 | 9/2018 | Matsushita et al. | |
| 2018/0261714 A1* | 9/2018 | Taniguchi | H01L 33/62 |
| 2018/0287335 A1 | 10/2018 | Kozuru et al. | |
| 2019/0094673 A1* | 3/2019 | Tian | G02B 27/48 |
| 2019/0203908 A1 | 7/2019 | Kiyota et al. | |

FOREIGN PATENT DOCUMENTS

| | | |
|---|---|---|
| JP | 2016-219779 A | 12/2016 |
| JP | 2017-208484 A | 11/2017 |

\* cited by examiner

LIGHT SOURCE DEVICE AND PROJECTOR

The present application is based on, and claims priority from JP Application Serial Number 2018-082632, filed Apr. 23, 2018, the disclosure of which is hereby incorporated by reference herein in its entirety.

BACKGROUND

1. Technical Field

The present disclosure relates to a light source device and a projector.

2. Related Art

In recent years, a projector using a laser source as a light source wide in color gamut and high in efficiency with the view to an improvement in performance of the projector attracts attention.

In JP-A-2016-219779 (Document 1), there is disclosed a light emitting device provided with a substrate, a plurality of semiconductor laser elements and a lens array. As such a light emitting device, there is disclosed a light emitting device having a configuration in which the plurality of semiconductor laser elements is mounted on a salient part of the substrate provided with the salient part and a sidewall, a space housing the semiconductor laser elements is sealed by a sealing member having a window part and a light transmissive member, and the lens array is disposed on an upper surface of the sealing member.

The light emitting device of Document 1 has a problem that the configuration is complicated, and the manufacturing process thereof is cumbersome.

SUMMARY

An advantage of some aspects of the present disclosure is to provide a light source device configured to achieve simplification of the device configuration and the manufacturing process to solve the problem. Another advantage of some aspects of the present disclosure is to provide a projector equipped with the light source device described above.

A light source device according to an aspect of the present disclosure includes a substrate having a first surface, a plurality of light emitting elements disposed on the first surface side of the substrate, a frame body which is disposed so as to surround the plurality of light emitting elements, and which is bonded on the first surface side of the substrate, and a lid body which has a light transmissive member configured to transmit light emitted from the plurality of light emitting elements, which is disposed so as to be opposed to the first surface of the substrate, and which is bonded on an opposite side of the frame body to the substrate. The plurality of light emitting elements is housed in a housing space, the housing space being formed by the substrate, the frame body and the lid body, and the frame body is formed of a material including a nonconductive material.

In the light source device according to the aspect of the present disclosure, the lid body may further include a support member to which the light transmissive member is bonded, and the support member may be bonded on an opposite side of the frame body to the substrate.

A light source device according to another aspect of the present disclosure includes a substrate having a first surface, a plurality of light emitting elements disposed on the first surface side of the substrate, and a light transmissive member which has a recessed section configured to cover the plurality of light emitting elements, and which is bonded to the first surface side of the substrate. The light transmissive member is formed of a material including a nonconductive material.

The light source device according to the aspect of the present disclosure may further include an insulating layer disposed on the first surface of the substrate, and an interconnection layer disposed on an opposite side of the insulating layer to the substrate, and a connection terminal of the light emitting element and the interconnection layer may electrically be connected to each other.

A projector according to another aspect of the present disclosure includes the light source device according to any one of the above aspects of the present disclosure, a light modulation device configured to modulate light from the light source device in accordance with image information, and a projection optical device configured to project the light modulated by the light modulation device.

DESCRIPTION OF EXEMPLARY EMBODIMENTS

First Embodiment: Light Source Device

Hereinafter, a first embodiment of the present disclosure will be described using FIG. 1 through FIG. 4D.

In each of the following embodiments, an example of a light source device suitably used for a projector described later will be described.

It should be noted that in all of the following drawings, the constituents may be shown with the scale ratios of respective sizes set differently between the constituents in order to facilitate the visualization of each of the constituents.

First Configuration Example of First Embodiment

Figure 1:
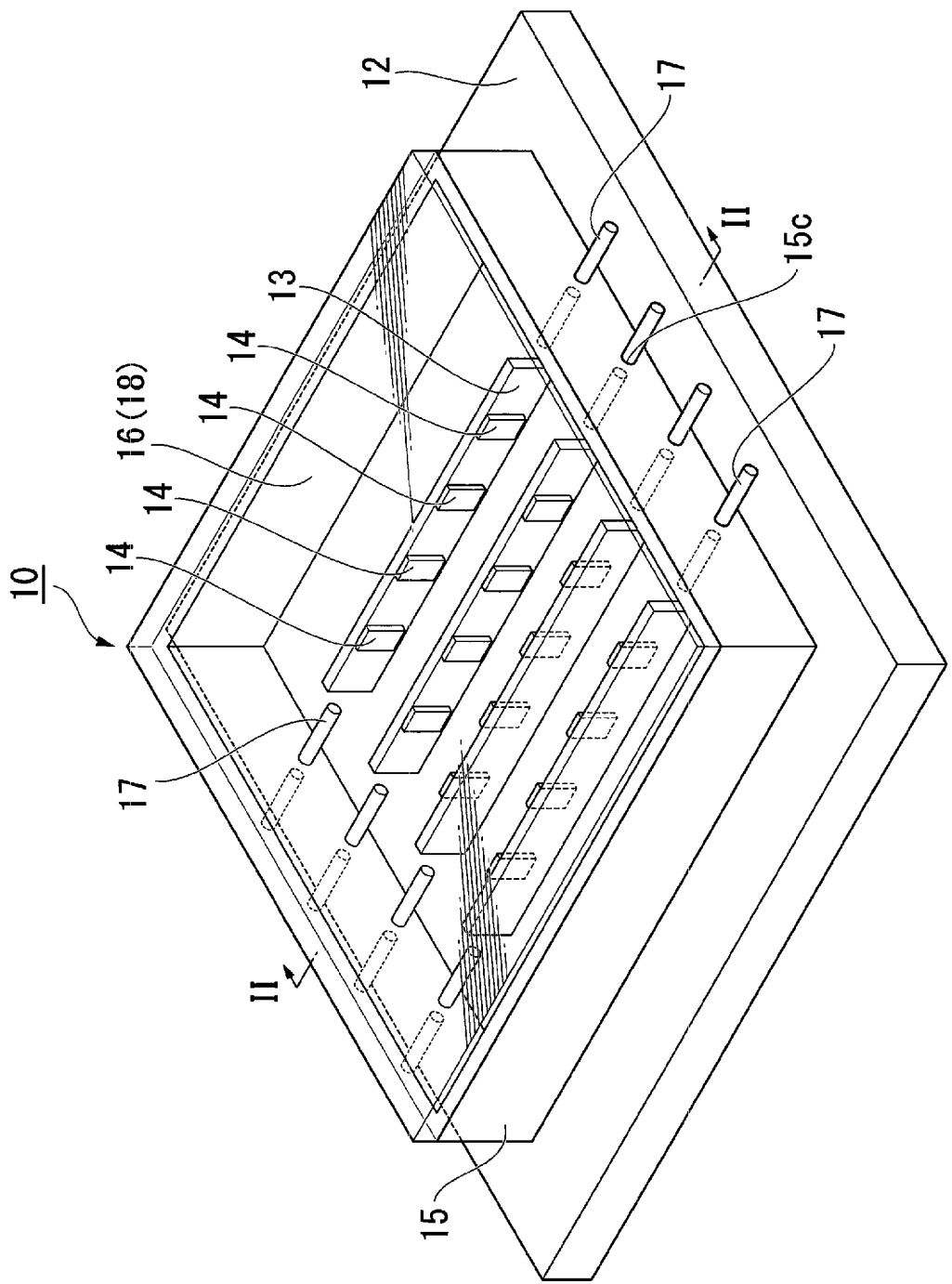
FIG. 1 is a perspective view of a light source device according to a first configuration example of a first embodiment.

FIG. 1 is a perspective view of a light source device 10 according to a first configuration example of the first embodiment.

Figure 2:
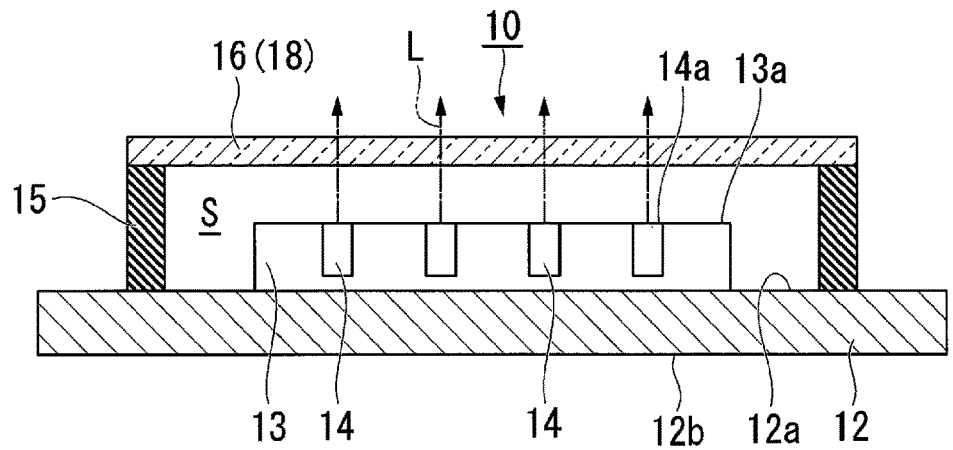
FIG. 2 is a cross-sectional view of the light source device along the line II-II shown in FIG. 1.

FIG. 2 is a cross-sectional view of the light source device 10 along the line II-II shown in FIG. 1.

As shown in FIG. 1 and FIG. 2, the light source device 10 according to the present configuration example is provided with a substrate 12, a plurality of sub-mounts 13, a plurality of light emitting elements 14, a frame body 15, a lid body 16 and a plurality of lead terminals 17. The substrate 12, the frame body 15 and the lid body 16 are each a separate member, and are bonded to each other.

The substrate 12 is formed of a plate material having a first surface 12a, and a second surface 12b located on the opposite side to the first surface 12a. The substrate 12 has a quadrangular shape such as a roughly square shape or a roughly rectangular shape in a plan view viewed from a normal direction of the first surface 12a. On the first surface 12a side of the substrate 12, there is disposed a plurality of light emitting elements 14 via a plurality of sub-mounts 13 described later.

On the second surface 12b of the substrate 12, there is disposed a heat radiation member (not shown) such as a fin or a heatsink for radiating the heat generated from the plurality of light emitting elements 14 as needed when emitting light. Therefore, the substrate 12 is formed of a metal material high in thermal conductivity. As the metal material of this kind, there is preferably used copper, aluminum or the like, and copper is particularly preferably used.

In the following description, a simple description of a "plan view" denotes a plan view viewed from a normal direction of the first surface 12a of the substrate 12.

As shown in FIG. 1, the plurality of sub-mounts is disposed at predetermined intervals in the first surface 12a of the substrate 12 in a direction parallel to a side of the substrate 12. Each of the sub-mounts 13 is disposed so as to correspond to two or more of the light emitting elements 14. In the first configuration example, the sub-mounts 13 are each disposed commonly to the four light emitting elements 14, but the number of the light emitting elements 14 is not particularly limited.

The sub-mounts 13 are each formed of a ceramic material such as aluminum nitride or alumina. The sub-mounts 13 each intervene between the substrate 12 and the light emitting elements 14 to thereby relax the thermal stress generated due to a difference in linear expansion coefficient between the substrate 12 and the light emitting elements 14. The sub-mounts 13 are each bonded to the substrate 12 with a bonding material such as a silver brazing material or gold-tin solder.

The plurality of light emitting elements 14 is disposed on the first surface 12a side of the substrate 12. The light emitting elements 14 are each formed of a solid-state light source such as a semiconductor laser or a light emitting diode. As the light emitting elements 14, it is sufficient to use light emitting elements with arbitrary wavelengths in accordance with the intended use of the light source device 10. In the first embodiment, as the light emitting elements 14 for emitting blue light with the wavelength of 430 nm through 490 nm for exciting a phosphor, there are used edge emitting type semiconductor lasers each formed of, for example, a nitride-type semiconductor ($In_X Al_Y Ga_{1-X-Y}N$, $0 \leq X \leq 1$, $0 \leq Y \leq 1$, $X+Y \leq 1$). Further, it is also possible to include a compound obtained by displacing some of the group-III elements with boron atoms, a compound obtained by displacing some of the nitrogen atoms as the group-V elements with phosphorus atoms, arsenic atoms, and so on in addition to the general expression described above.

As shown in FIG. 1, the plurality of light emitting elements 14 each have a configuration in which, for example, (m×n) (m, n: a natural number no smaller than two) semiconductor lasers are arranged in an m×n matrix in the plan view. In the first embodiment, as the plurality of light emitting elements 14, there are arranged, for example, 16 semiconductor lasers in a 4×4 matrix.

As shown in FIG. 2, the light emitting elements 14 are each disposed on the sub-mount 13 so that a surface located on an opposite side to a light emitting surface 14a out of the six surfaces of the light emitting element 14 having a rectangular solid shape is opposed to the first surface 12a of the substrate 12. According to this arrangement, each of the light emitting elements 14 emits light L in a direction roughly perpendicular to the first surface 12a of the substrate 12. Further, the light emitting elements 14 are each disposed on the sub-mount 13 so that the light emission surface 14a is aligned on roughly the same plane as one end surface 13a of the sub-mount 13. The light emitting elements 14 are each bonded to the sub-mount 13 with a bonding material (not shown) such as a silver brazing material or gold-tin solder.

The frame body 15 is disposed so as to surround the plurality of light emitting elements 14, and is bonded on the first surface 12a side of the substrate 12. The frame body 15 has a quadrangular annular shape in the plan view. The frame body 15 can be a member having four sides of the quadrangular shape integrated with each other, or can also have a configuration having a plurality of members bonded to each other. The frame body 15 keeps the distance (interval) between the substrate 12 and the lid body 16 constant, and constitutes a part of the housing space S in which the plurality of light emitting elements 14 is housed. Therefore, it is preferable for the frame body 15 to have predetermined rigidity.

The frame body 15 fulfills a role for relaxing the stress generated in the lid body 16. Therefore, it is preferable for the frame body 15 to be formed of a material having a linear expansion coefficient lower than the linear expansion coefficient of the substrate 12 and higher than the linear expansion coefficient of the lid body 16.

The frame body 15 is formed of a material including insulating resin. In other words, the frame body is formed of a material including a nonconductive material. As an example of the insulating resin, there can be cited the following thermoplastic resin, thermoset resin, and so on.

As the thermoplastic resin, there can be cited acrylic resin (PMMA), acrylonitrile-butadiene-styrene resin (ABS), polycarbonate (PC), liquid crystal polymer (LCP) and so on.

Further, as the thermoset resin, there can be cited epoxy resin (EP), phenol resin (PF), thermoset polyimide (PI) and so on.

In the case of using the thermoplastic resin as the material of the frame body 15, it is possible to reduce the emission of the outgas derived from an unreacted component in the resin in the bonding process compared to the case of using the thermoset resin. It should be noted that even in the case of using the thermoset resin as the material of the frame body 15, it is possible to reduce the emission of the outgas by performing a calcination process after sufficiently progressing the thermal curing reaction. By reducing the emission of the outgas, it is possible to enhance the reliability of the light emitting elements 14.

The lid body 16 is formed of a light transmissive member 18 for transmitting the light L emitted from the plurality of light emitting elements 14. The lid body 16 is disposed so as to be opposed to the first surface 12a of the substrate 12, and is bonded on an opposite side of the frame body 15 to the substrate 12. The lid body 16 has a quadrangular shape including a square shape and a rectangular shape in the plan view. As a material of the light transmissive member 18, there is preferably used a light transmissive material high in optical transmittance. As a specific example of the light transmissive member 18, there is used borosilicate glass such as BK7, optical glass including silica glass and synthetic silica glass or the like, quartz crystal, sapphire or the like.

In the present embodiment, the substrate 12 and the frame body 15 are bonded to each other by welding with the organic resin material constituting the frame body 15. Similarly, the frame body 15 and the lid body 16 are bonded to each other by welding with the organic resin material constituting the frame body 15. It should be noted that the substrate 12 and the frame body 15, and the frame body 15 and the lid body 16 can be bonded to each other with the bonding material including the organic adhesive instead of welding.

By the substrate 12 and the frame body 15 being bonded to each other, and the frame body 15 and the lid body 16 being bonded to each other, the space surrounded by the substrate 12, the frame body 15 and the lid body 16 becomes an enclosed space which is blocked off from the ambient air, and which is for airtightly housing the plurality of light emitting elements 14. Hereinafter, the enclosed space is referred to as a housing space S. In other words, the plurality of light emitting elements 14 is housed in the housing space S formed by the substrate 12, the frame body 15 and the lid body 16.

By the plurality of light emitting elements 14 being housed in the housing space S, adherence of foreign matters such as organic substances or moisture to the light emitting elements 14 can be reduced. It is preferable for the housing space S to be in a reduced pressure state. Alternatively, it is possible for the housing space S to be filled with an inert gas such as nitrogen gas, or dry air. It should be noted that the reduced pressure state denotes a state of a space filled with a gas in the pressure lower than the atmospheric pressure. In the reduced pressure state, the gas with which the housing space S is filled is preferably the inert gas or the dry air.

As shown in FIG. 1, the frame body 15 is provided with a plurality of through holes 15c. In each of the through holes 15c, there are respectively disposed the lead terminals 17 for supplying each of the light emitting elements 14 with electrical power. As a constituent material of the lead terminals 17, there is used Kovar, for example. On the surface of each of the lead terminals 17, there is disposed a plated layer made of, for example, nickel-gold.

In FIG. 1, there is shown an example in which the plurality of light emitting elements 14 mounted on one sub-mount 13 is connected in series to each other, and the pair of lead terminals 17 are respectively disposed on the lateral sides of each of the sub-mounts 13. It should be noted that the electrical connection of the plurality of light emitting elements 14 and the arrangement of the lead terminals 17 are not limited to this example, but can arbitrarily be modified.

In the housing space S, there are disposed bonding wires (not shown) each for electrically connecting one end of the lead terminal 17 and the terminal of the light emitting element 14 to each other. The other end of the lead terminal 17 is connected to an external circuit (not shown). A gap between an inner wall of the through hole 15c of the frame body 15 and the lead terminal 17 is sealed with a sealing material. As the sealing material, low-melting-point glass, for example, is preferably used.

Second Configuration Example of First Embodiment

Hereinafter, a second configuration example of the first embodiment will be described using FIG. 3.

A light source device according to the second configuration example is substantially the same in basic configuration as that of the first configuration example, but is different in the configuration of the frame body from that of the first configuration example. Therefore, the description of the whole of the light source device will be omitted, and only the configuration different from that of the first configuration example will be described.

Figure 3:
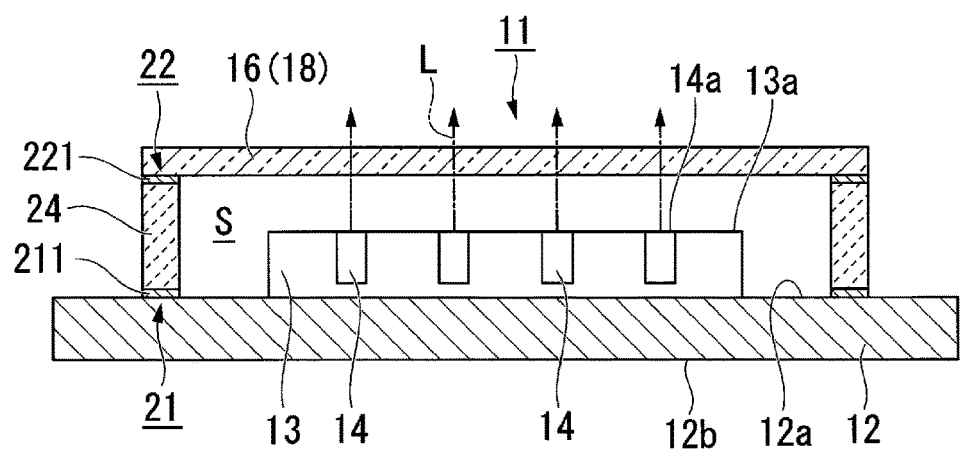
FIG. 3 is a cross-sectional view of a light source device according to a second configuration example of the first embodiment.

FIG. 3 is a cross-sectional view of a light source device 11 according to the second configuration example of the first embodiment. FIG. 3 corresponds to a cross-sectional view at the same position as the line II-II shown in FIG. 1.

In FIG. 3, the constituents common to the drawing used in the first configuration example are denoted by the same reference symbols, and the description thereof will be omitted.

As shown in FIG. 3, in the light source device 11 according to the second configuration example, a frame body 24 is formed of a material including a ceramic material as a kind of the nonconductive material. As the ceramic material, there is preferably used a ceramic material such as alumina, silicon carbide, or silicon nitride.

Hereinafter, a bonding section with which the substrate 12 and the frame body 24 are bonded to each other is referred to as a first bonding section 21, and a bonding section with which the frame body 24 and the lid body 16 are bonded to each other is referred to as a second bonding section 22.

In the first bonding section 21, the substrate 12 and the frame body 24 are bonded to each other with a bonding material 211 including an organic adhesive. As the organic adhesive, there is preferably used, for example, a silicone-based adhesive, an epoxy resin-based adhesive, or an acrylic resin-based adhesive.

In the second bonding section 22, the frame body and the lid body 16 are bonded to each other with a bonding material 221 including a metal material such as a silver brazing material or gold-tin solder, or an inorganic material such as low-melting-point glass. The second bonding section 22 has a quadrangular annular shape in the plan view similar to the frame body 24. Alternatively, it is also possible for the frame body 24 and the lid body 16 to be bonded to each other with the bonding material 211 including the organic adhesive similarly to the first bonding section 21.

Method of Manufacturing Light Source Device of First Embodiment

Hereinafter, a method of manufacturing the light source devices 10, 11 according to the configuration examples described above will be described using FIG. 4A through FIG. 4D.

FIG. 4A through FIG. 4D are perspective views showing the manufacturing process of the light source devices 10, 11 according to the first embodiment step by step.

Figure 4A:
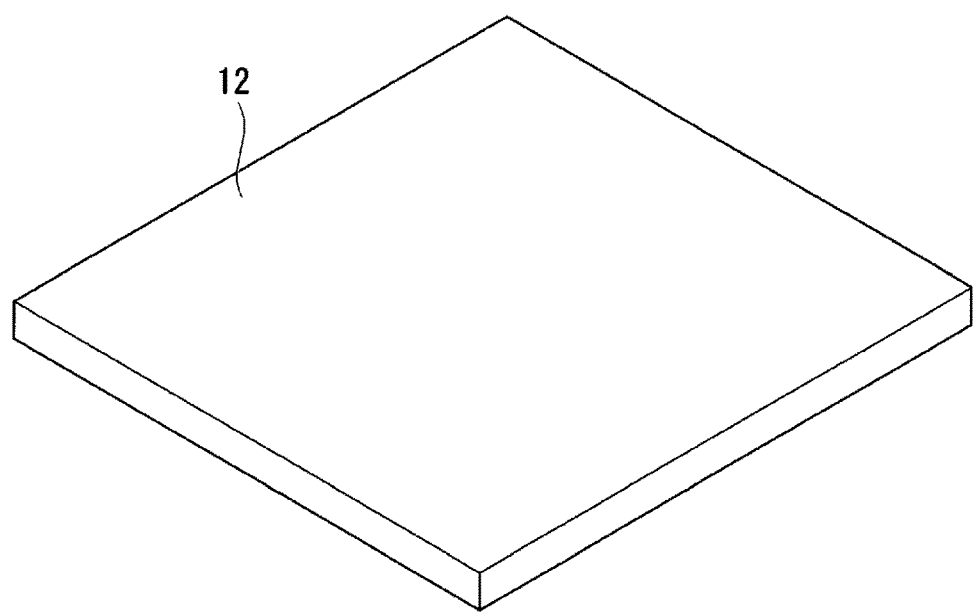
FIG. 4A is a perspective view showing one process in a manufacturing process of the light source device according to the first embodiment.

First of all, as shown in FIG. 4A, the substrate 12 is prepared.

Figure 4B:
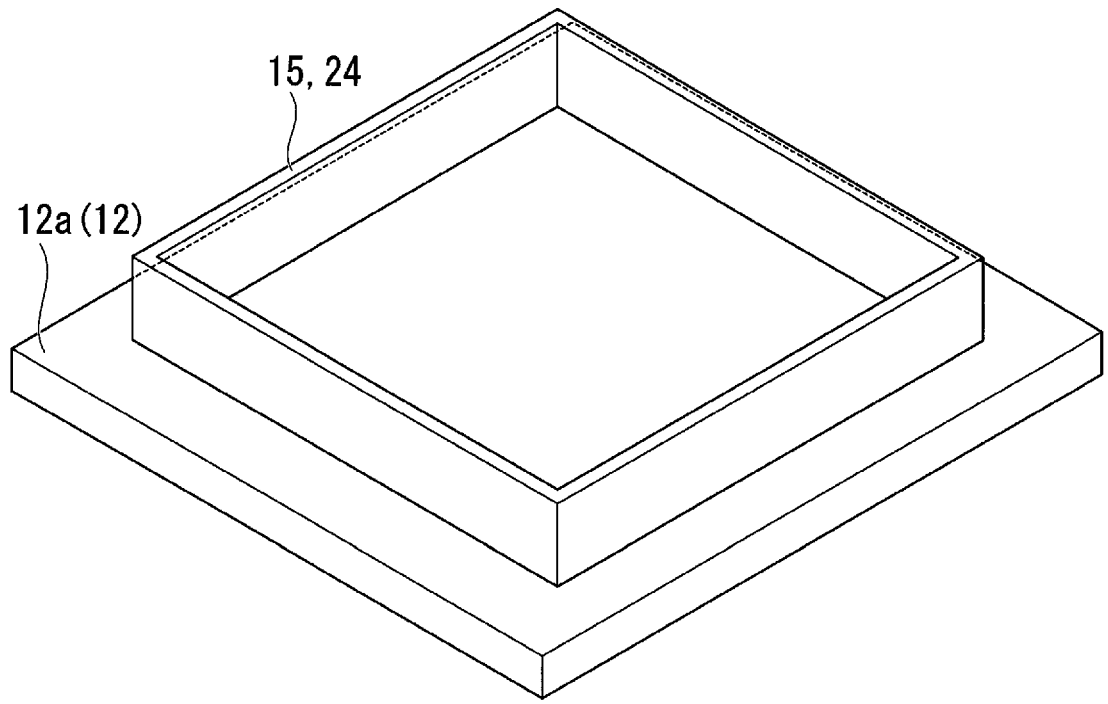
FIG. 4B is a perspective view showing a subsequent process to the process shown in FIG. 4A.

Subsequently, as shown in FIG. 4B, the frame body 15, 24 is bonded to the first surface 12a of the substrate 12. On this occasion, in the case of using the frame body 15 made of the organic resin material, the heat is applied in the state in which the frame body 15 and the substrate 12 have contact with each other to weld the frame body 15 and the substrate 12 to each other.

Alternatively, in the case of using the frame body 24 made of a ceramic material, the heat is applied in the state in which the bonding material 211 intervenes between the frame body 24 and the substrate 12 to bond the frame body 15 and the substrate 12 to each other with the bonding material 211. Thus, the frame body 24 is bonded to the first surface 12a of the substrate 12. Further, although the illustration is omitted, it is possible to attach the plurality of lead terminals 17 to the frame body 15, 24 in advance.

Figure 4C:
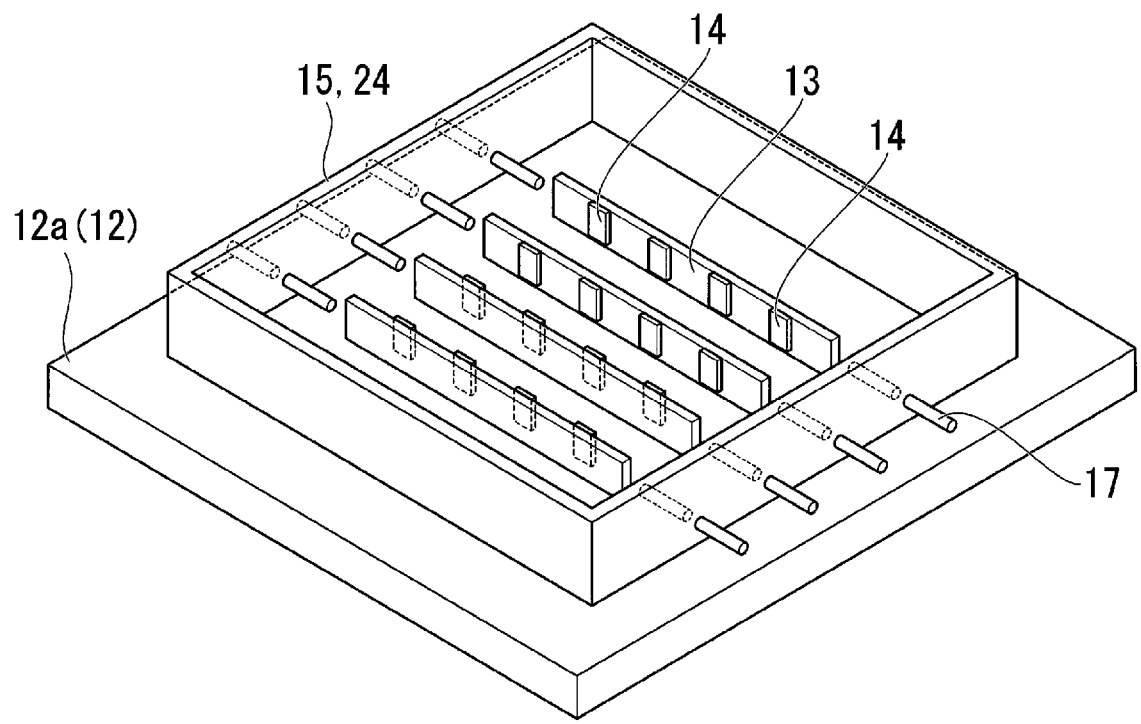
FIG. 4C is a perspective view showing a subsequent process to the process shown in FIG. 4B.

Subsequently, as shown in FIG. 4C, the plurality of light emitting elements 14 is mounted on the first surface 12a of the substrate 12. On this occasion, the plurality of sub-mounts 13 on which the plurality of (four) light emitting elements 14 is mounted is prepared in advance. Then, after applying the bonding material to a bonding surface (the lower surface) of each of the sub-mounts 13 with the substrate 12 or the first surface 12a of the substrate 12, the heat is applied in the state of making the sub-mount 13 and the substrate 12 have contact with each other to make the bonding material cure. Thus, the plurality of light emitting elements 14 is bonded to the first surface 12a of the substrate 12 via the sub-mounts 13.

Subsequently, although the illustration is omitted, the light emitting elements 14 and the lead terminals 17 are electrically connected to each other using the bonding wires. Specifically, one end of the bonding wire is bonded to the lead terminal 17, and the other end of the bonding wire is bonded to the connection terminal of the light emitting element 14 using a method such as ultrasonic bonding or thermocompression bonding.

Figure 4D:
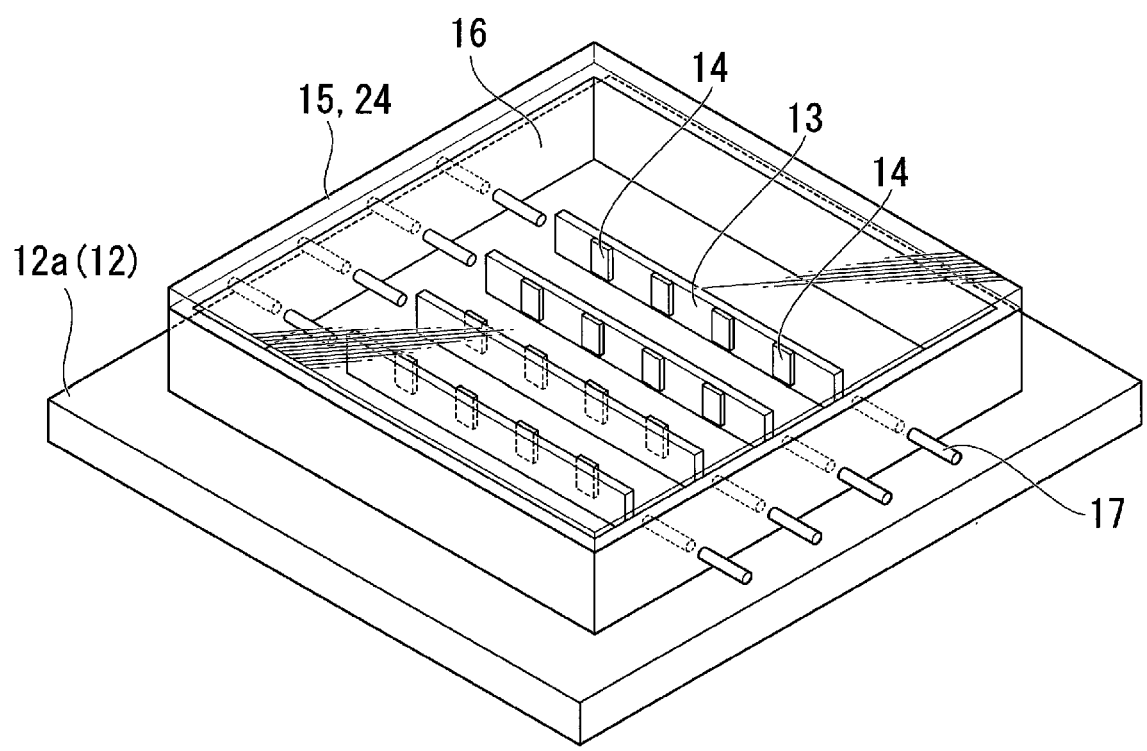
FIG. 4D is a perspective view showing a subsequent process to the process shown in FIG. 4C.

Subsequently, as shown in FIG. 4D, the lid body 16 is bonded to the upper surface of the frame body 15. On this occasion, in the case of using the frame body 15 made of the organic resin material, the heat is applied in the state in which the frame body 15 and the lid body 16 have contact with each other to weld the frame body 15 and the lid body 16 to each other.

Alternatively, in the case of using the frame body 24 made of a ceramic material, the heat is applied in the state in which the bonding material 221 intervenes between the frame body 24 and the lid body 16 to bond the frame body 15 and the lid body 16 to each other via the bonding material 221.

Thus, the lid body 16 is bonded to the upper surface of the frame body 15, 24. On this occasion, by performing the bonding described above in the reduced-pressure atmosphere, the inert gas atmosphere, or the dry air atmosphere, the inside of the housing space S becomes in the reduced-pressure state, or the state filled with the inert gas or the dry air, respectively.

Due to the process described hereinabove, the light source device 10, 11 according to the first embodiment is completed.

It should be noted that the execution sequence of the bonding process of the frame body 15, 24 to the substrate 12 shown in FIG. 4B and the bonding process of the light emitting elements 14 to the substrate 12 via the sub-mounts 13 shown in FIG. 4C can be reversed. It should be noted that if the bonding process of the frame body 15, 24 is performed first as in the example described above, it is possible to prevent the heat generated in the bonding process of the frame body 15, 24 from being applied to the light emitting elements 14.

The light source devices 10, 11 according to the first embodiment are each small in the number of constituents including the substrate 12, the frame body 15, 24, the plurality of light emitting elements 14, the lid body 16 and so on, and thus, it is possible to simplify the device configuration and the manufacturing process compared to the light source device of the related art. Thus, the productivity of the light source device 10 is enhanced, and at the same time, it is possible to reduce the manufacturing cost.

In particular, according to the light source devices 10, 11 of the first embodiment, since the frame body 15, 24 is formed of the nonconductive material such as an organic resin material or a ceramic material, an insulating structure between the lead terminals 17 and interconnections on the substrate 12 for supplying the light emitting elements 14 with the electrical power and the frame body 15, 24 becomes unnecessary. Thus, it is possible to achieve the simplification of the device configuration and the manufacturing process while keeping the reliability of the electrical connection related to the light emitting elements 14.

Second Embodiment

A second embodiment of the present disclosure will hereinafter be described using FIG. 5 through FIG. 7.

A light source device according to the second embodiment is substantially the same in basic configuration as that of the first embodiment, but is different in the configuration of the lid body from that of the first embodiment. Therefore, the description of the whole of the light source device will be omitted, and only the configuration different from that of the first embodiment will be described.

Figure 5:
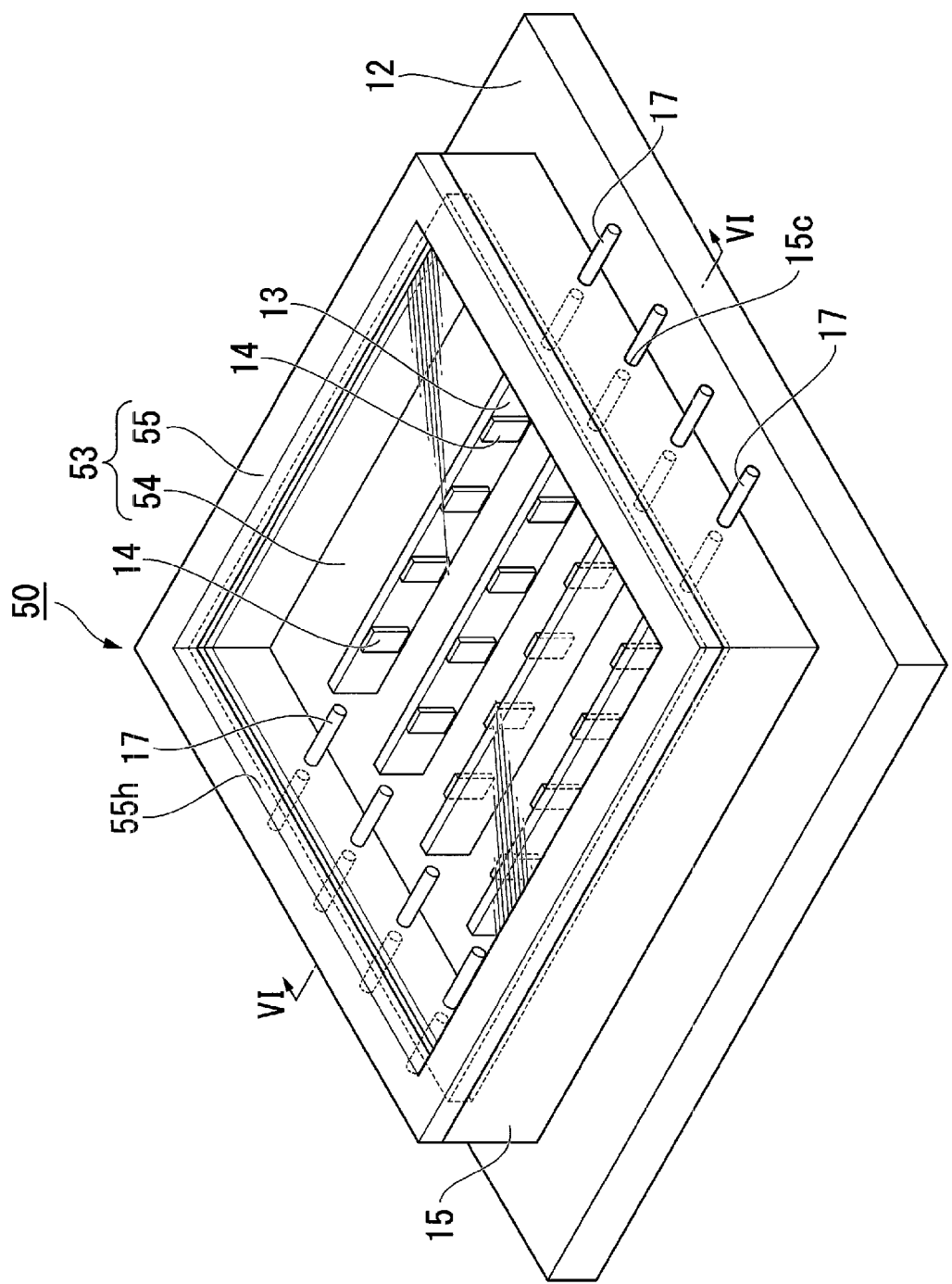
FIG. 5 is a perspective view of a light source device according to a first configuration example of a second embodiment.

FIG. 5 is a perspective view of a light source device 50 according to a first configuration example of the second embodiment. FIG. 6 is a cross-sectional view of the light source device 50 along the line VI-VI shown in FIG. 5.

Figure 6:
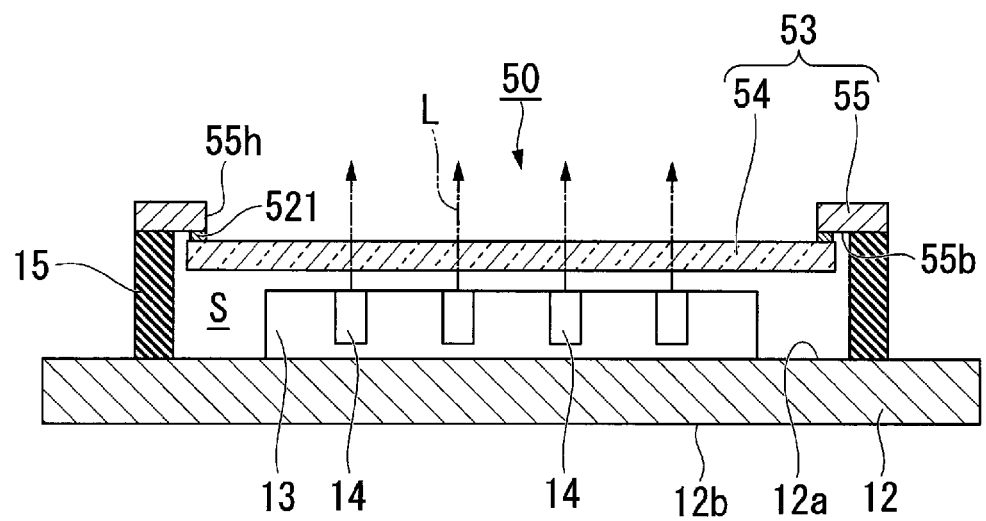
FIG. 6 is a cross-sectional view of the light source device along the line VI-VI shown in FIG. 5.

In FIG. 5 and FIG. 6, the constituents common to the drawings used in the first embodiment are denoted by the same reference symbols, and the description thereof will be omitted.

First Configuration Example of Second Embodiment

As shown in FIG. 5 and FIG. 6, the light source device 50 according to the second embodiment is provided with the substrate 12, the plurality of sub-mounts 13, the plurality of light emitting elements 14, the frame body 15, a lid body 53 and the plurality of lead terminals 17. The substrate 12, the frame body 15 and the lid body 53 are each a separate member, and are bonded to each other.

The lid body 53 has a light transmissive member 54 and a support member 55 to which the light transmissive member 54 is bonded. In the second embodiment, the light transmissive member 54 is bonded to a surface 55b (the lower surface in FIG. 5) opposed to the first surface 12a of the substrate 12 out of the two surfaces of the support member 55.

The support member 55 is configured to have a rectangular frame shape in the plan view, and has an opening section 55h having a quadrangular shape at the center thereof. The support member 55 is bonded on the opposite side of the frame body 15 to the substrate 12. The support member 55 is formed of a metal material such as copper or aluminum. It is also possible to dispose a plating layer made of, for example, nickel on a surface of the support member 55. It should be noted that the support member 55 can also be formed of a material other than metal materials.

The light transmissive member 54 has a quadrangular shape such as a square shape or a rectangular shape in the plan view, and has external dimensions one-size larger than those of the opening section 55h of the support member 55. As a material of the light transmissive member 54, there is preferably used a light transmissive material high in optical transmittance. As a specific example of the light transmissive member 54, there is used borosilicate glass such as BK7, optical glass including silica glass and synthetic silica glass or the like, quartz crystal, sapphire or the like.

In the first configuration example of the second embodiment, the substrate 12 and the frame body 15 are bonded to each other by welding with the organic resin material as the constituent material of the frame body 15. Similarly, the frame body 15 and the support member 55 (the lid body 53) are bonded to each other by welding with the organic resin material as the constituent material of the frame body 15. It should be noted that the substrate 12 and the frame body 15, and the frame body 15 and the support member 55 (the lid body 53) can be bonded to each other with the bonding material including an organic adhesive instead of welding.

The support member 55 and the light transmissive member 54 are bonded to each other with a bonding material 521 including a metal material such as a silver brazing material or gold-tin solder, or an inorganic material such as low-melting-point glass. Alternatively, the support member 55 and the light transmissive member 54 can also be bonded to each other with the bonding material including an organic adhesive such as a silicone-based adhesive, an epoxy resin-based adhesive or an acrylic resin-based adhesive.

Second Configuration Example of Second Embodiment

Hereinafter, a second configuration example of the second embodiment will be described using FIG. 7.

A light source device according to the second configuration example is substantially the same in basic configuration as that of the first configuration example, but is different in the configuration of the frame body from that of the first configuration example. Therefore, the description of the whole of the light source device will be omitted, and only the configuration different from that of the first configuration example will be described.

Figure 7:
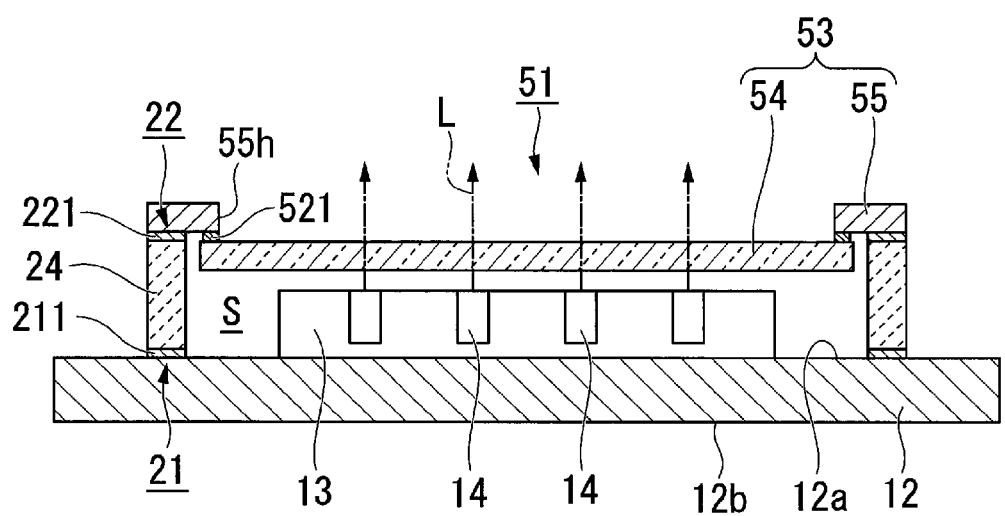
FIG. 7 is a cross-sectional view of a light source device according to a second configuration example of the second embodiment.

FIG. 7 is a cross-sectional view of a light source device 51 according to the second configuration example of the second embodiment.

In FIG. 7, the constituents common to the drawing used in the embodiments described above are denoted by the same reference symbols, and the description thereof will be omitted.

As shown in FIG. 7, in the light source device 51 according to the second configuration example, the frame body 24 is formed of the material including a ceramic material as a kind of the nonconductive material. As the ceramic material, there is preferably used a ceramic material such as alumina, silicon carbide, or silicon nitride.

In the first bonding section 21, the substrate 12 and the frame body 24 are bonded to each other with the bonding material 211 including the organic adhesive. As the organic adhesive, there is preferably used, for example, a silicone-based adhesive, an epoxy resin-based adhesive, or an acrylic resin-based adhesive.

In the second bonding section 22, the frame body 24 and the lid body 53 are bonded to each other with the bonding material 221 including the metal material such as a silver brazing material or gold-tin solder, or the inorganic material such as low-melting-point glass. Alternatively, it is also possible for the frame body 24 and the lid body 53 to be bonded to each other with the bonding material 211 including the organic adhesive similarly to the first bonding section 21.

When manufacturing the light source device 50, 51 according to the second embodiment, it is sufficient to bond the support member 55 and the light transmissive member 54 to each other to manufacture the lid body 53 in advance of the process of bonding the lid body 53 and the frame body 15, 24 to each other. The rest of the process is substantially the same as that of the first embodiment.

Also in the light source devices 50, 51 according to the second embodiment, it is possible to obtain substantially the same advantages in the first embodiment such as the advantage that the device configuration including the terminal extraction structure of the light emitting elements 14 can be simplified, the advantage that productivity of the light source device 50, 51 is enhanced to make it possible to reduce the manufacturing cost, the advantage that simplification of the manufacturing process can be achieved, and the advantage that the reliability of the light source device 50, 51 can be enhanced.

Further, in the case of the second embodiment, the light transmissive member 54 is disposed on the substrate 12 side of the support member 55. Thus, it is possible to shorten the distance between the light emitting elements 14 and the light transmissive member 54. In general, the light emitted from the light emitting elements 14 such as semiconductor lasers is diverging light. Therefore, the shorter the distance between the light emitting elements 14 and the light transmissive member 54 becomes, the more efficiently the light L emitted from the light emitting elements 14 can be taken out through the light transmissive member 54. Further, it is also possible to provide the light transmissive member 54 with an optical element such as a collecting lens. Also in such a case, since the distance between the light emitting elements 14 and the optical element shortens, it is possible to efficiently use the light L emitted from the light emitting elements 14.

Third Embodiment

Hereinafter, a third embodiment of the present disclosure will be described using FIG. 8 through FIG. 10.

A light source device according to the third embodiment is substantially the same in basic configuration as that of the first embodiment, but is different in the configuration of the lid body from that of the first embodiment. Therefore, the description of the whole of the light source device will be omitted, and only the configuration different from that of the first embodiment will be described.

Figure 8:
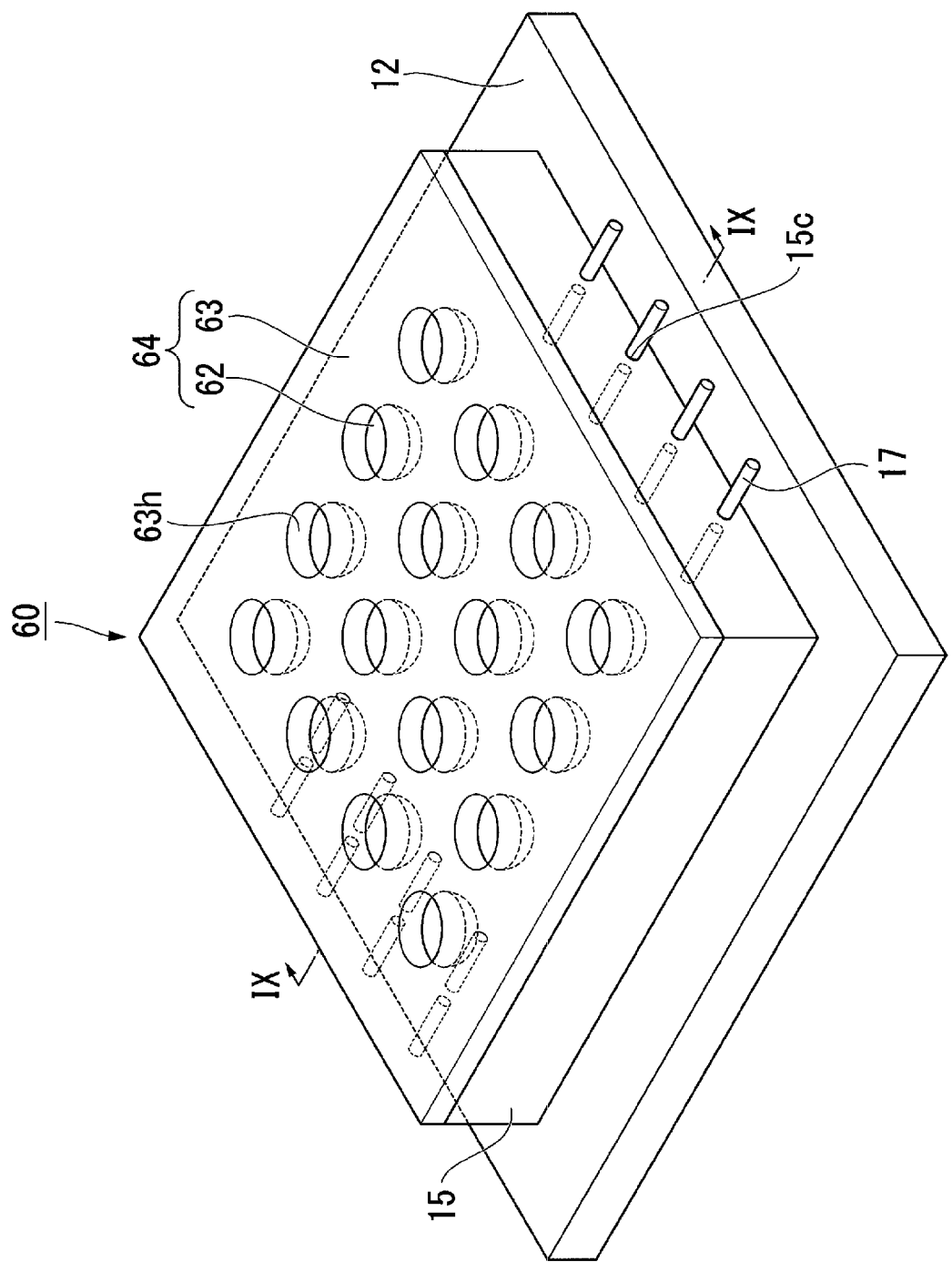
FIG. 8 is a perspective view of a light source device according to a first configuration example of a third embodiment.

FIG. 8 is a perspective view of a light source device 60 according to a first configuration example of the third embodiment. FIG. 9 is a cross-sectional view of the light source device 60 along the line IX-IX shown in FIG. 8.

Figure 9:
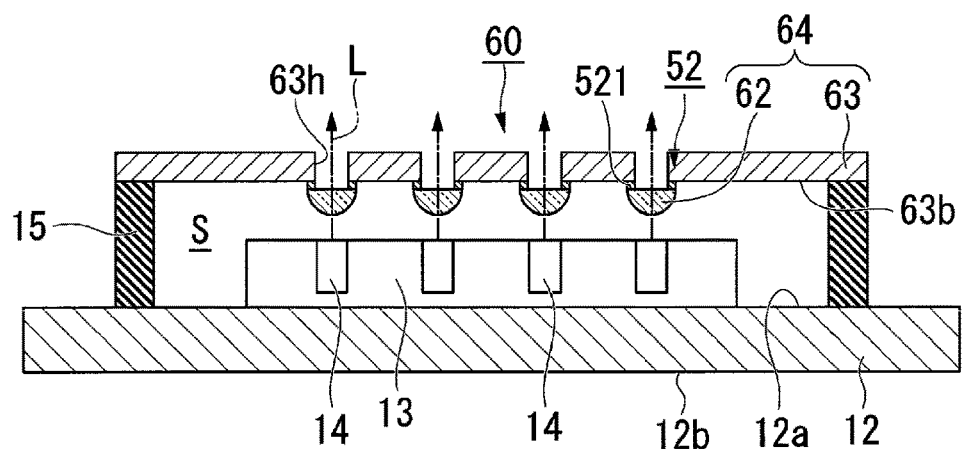
FIG. 9 is a cross-sectional view of the light source device along the line IX-IX shown in FIG. 8.

In FIG. 8 and FIG. 9, the constituents common to the drawings used in the embodiments described above are denoted by the same reference symbols, and the description thereof will be omitted.

First Configuration Example of Third Embodiment

As shown in FIG. 8 and FIG. 9, the light source device 60 according to the first configuration example is provided with the substrate 12, the plurality of sub-mounts 13, the plurality of light emitting elements 14, the frame body 15, a lid body 64 and the plurality of lead terminals 17. The substrate 12, the frame body 15 and the lid body 64 are each a separate member, and are bonded to each other.

The lid body 64 has a plurality of light transmissive members 62 and a support member 63 to which the plurality of light transmissive members 62 is bonded. In the third embodiment, the plurality of light transmissive members 62 is bonded to a surface 63b (the lower surface in FIG. 9) opposed to the first surface 12a of the substrate 12 out of the two surfaces of the support member 63.

The support member 63 is formed of a rectangular plate material in the plan view, and has opening sections 63h at positions corresponding to the paths of the light L emitted from the light emitting elements 14, respectively. In other words, the support member 63 has the same number of the opening sections 63h as the number of the light emitting elements 14. The support member 63 is bonded on the opposite side of the frame body 15 to the substrate 12. The support member 63 is formed of a metal material such as copper or aluminum. It is also possible to dispose a plating layer made of, for example, nickel on a surface of the support member 63.

Each of the light transmissive members 62 is formed of a plano-convex lens. The light transmissive member 62 formed of the plano-convex lens has a function of converging the light L emitted from each of the light emitting elements 14. The light transmissive members 62 each have external dimensions one-size larger than those of the opening section 63h of the support member 63 in the plan view. As a material of the light transmissive member 62, there is preferably used a light transmissive material high in optical transmittance. As a specific example of the light transmissive member 62, there is used borosilicate glass such as BK7, optical glass including silica glass and synthetic silica glass or the like, quartz crystal, sapphire or the like.

It should be noted that the light transmissive member 62 is not required to be formed of the plano-convex lens, but can also be formed of a flat plate providing the converging function is not particularly required. Further, it is also possible for the light transmissive members 62 to be bonded to a surface (the upper surface in FIG. 9) on the opposite side to the surface 63b of the support member 63.

In the first configuration example of the third embodiment, the substrate 12 and the frame body 15 are bonded to each other by welding with the organic resin material as the constituent material of the frame body 15. Similarly, the frame body 15 and the support member 63 (the lid body 64) are bonded to each other by welding with the organic resin material as the constituent material of the frame body 15. It should be noted that the substrate 12 and the frame body 15, and the frame body 15 and the lid body 64 can be bonded to each other with the bonding material including the organic adhesive instead of welding.

The support member 63 and each of the light transmissive members 62 are bonded to each other with the bonding material 521 including the metal material such as a silver brazing material or gold-tin solder, or the inorganic material such as low-melting-point glass. Alternatively, the support member 63 and each of the light transmissive members 62 can also be bonded to each other with the bonding material 521 including an organic adhesive such as a silicone-based adhesive, an epoxy resin-based adhesive or an acrylic resin-based adhesive.

Second Configuration Example of Third Embodiment

Hereinafter, a second configuration example of the third embodiment will be described using FIG. 10.

A light source device according to the second configuration example is substantially the same in basic configuration as that of the first configuration example, but is different in the configuration of the frame body from that of the first configuration example. Therefore, the description of the whole of the light source device will be omitted, and only the configuration different from that of the first configuration example will be described.

Figure 10:
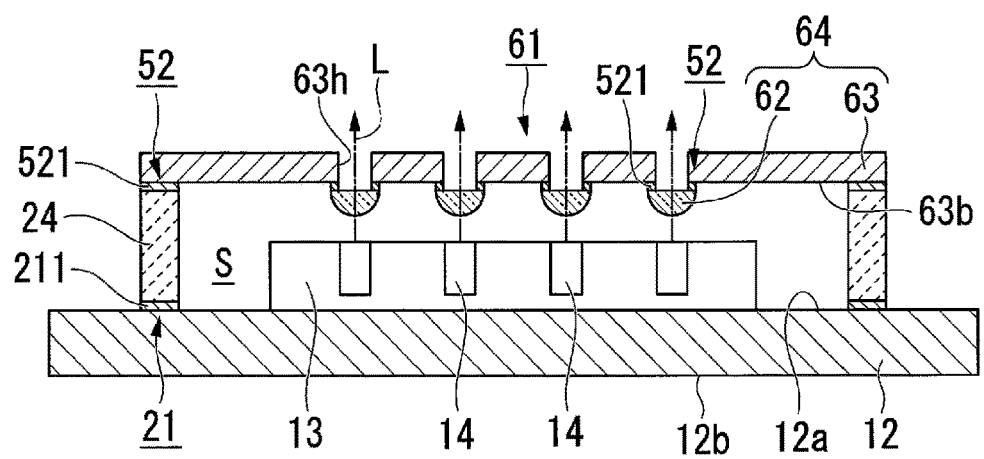
FIG. 10 is a cross-sectional view of a light source device according to a second configuration example of the third embodiment.

FIG. 10 is a cross-sectional view of the light source device 61 according to the second configuration example of the third embodiment.

In FIG. 10, the constituents common to the drawing used in the embodiments described above are denoted by the same reference symbols, and the description thereof will be omitted.

As shown in FIG. 10, in the light source device 61 according to the second configuration example, the frame body 24 is formed of the material including a ceramic material as a kind of the nonconductive material. As the ceramic material, there is preferably used a ceramic material such as alumina, silicon carbide, or silicon nitride.

In the first bonding section 21, the substrate 12 and the frame body 24 are bonded to each other with the bonding material 211 including the organic adhesive. As the organic adhesive, there is preferably used, for example, a silicone-based adhesive, an epoxy resin-based adhesive, or an acrylic resin-based adhesive.

In the second bonding section 52, the frame body 24 and the lid body 64 are bonded to each other with the bonding material 521 including the metal material such as a silver brazing material or gold-tin solder, or the inorganic material such as low-melting-point glass. Alternatively, it is also possible for the frame body 24 and the lid body 64 to be bonded to each other with the bonding material 211 including the organic adhesive similarly to the first bonding section 21. Similarly to the first configuration example, it is also possible for each of the light transmissive members 62 to be bonded to the surface 63b (the lower surface in FIG. 10) of the support member 63 opposed to the first surface 12a of the substrate 12, or bonded to a surface (the upper surface in FIG. 10) on the opposite side to the surface 63b.

When manufacturing the light source devices 60, 61 according to the third embodiment, it is sufficient to bond the support member 63 and each of the light transmissive members 62 to each other to manufacture the lid body 64 in advance of the process of bonding the lid body 64 and the frame body 15, 24 to each other. The rest of the process is substantially the same as that of the first embodiment.

Also in the light source devices 60, 61 according to the third embodiment, it is possible to obtain substantially the same advantages in the first embodiment such as the advantage that the device configuration including the terminal extraction structure of the light emitting elements 14 can be simplified, the advantage that productivity of the light source device 60, 61 is enhanced to make it possible to reduce the manufacturing cost, the advantage that simplification of the manufacturing process can be achieved, and the advantage that the reliability of the light source device 60, 61 can be enhanced.

Further, in the case of the third embodiment, the support member 63 is provided with the plurality of opening sections 63h corresponding respectively to the plurality of light emitting elements 14, and the plurality of light transmissive members 62 for covering the respective opening sections 63h. Therefore, the proportion of the total area of the light transmissive members 62 to the area of the support member 63 is low compared to the second embodiment provided with the light transmissive member 54 common to all of the light emitting elements 14. Further, it is preferable for the linear expansion coefficient of the support member 63 to be larger than the linear expansion coefficient of the light transmissive members 62. Further, it is preferable for the linear expansion coefficient of the support member 63 to be larger than the linear expansion coefficient of the substrate 12. In the case in which such a material is selected, it is possible to make the linear expansion coefficient of the lid body constituted by the support member 63 and the plurality of light transmissive members 62 larger than the linear expansion coefficient of the lid body 53 in the second embodiment to thereby be approximated to the linear expansion coefficient of the substrate 12.

Thus, even in the case in which the light source devices 60, 61 are exposed to a high temperature environment, it is possible to reduce the possibility that the light transmissive members 62 are damaged or separated from the support member 63. Due to this function, the reliability of the light source devices 60, 61 can be improved.

Further, similarly to the second embodiment, the plurality of light transmissive members 62 is disposed on the substrate 12 side of the support member 63. Thus, it is possible to shorten the distance between the light emitting elements 14 and the respective light transmissive members 62, and it is possible for the light transmissive members 62 to efficiently converge the light L emitted from the light emitting elements 14, respectively.

Fourth Embodiment

Hereinafter, a fourth embodiment of the present disclosure will be described using FIG. 11 and FIG. 12.

A light source device according to the fourth embodiment is substantially the same in basic configuration as that of the first embodiment, but is different in the configuration of the frame body and the lid body from that of the first embodiment. Therefore, the description of the whole of the light source device will be omitted, and only the configuration different from that of the first embodiment will be described.

Figure 11:
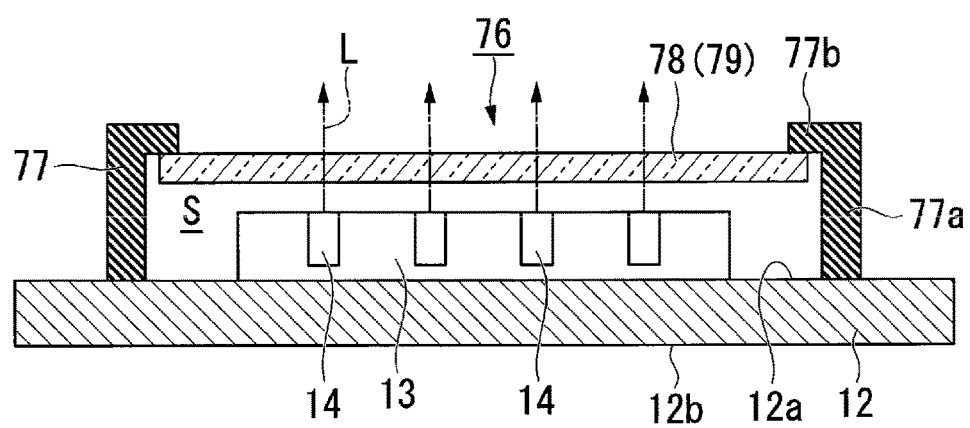
FIG. 11 is a cross-sectional view of a light source device according to a first configuration example of a fourth embodiment.

FIG. 11 is a cross-sectional view of a light source device 76 according to a first configuration example of the fourth embodiment.

In FIG. 11, the constituents common to the drawing used in the embodiments described above are denoted by the same reference symbols, and the description thereof will be omitted.

First Configuration Example of Fourth Embodiment

As shown in FIG. 11, the light source device 76 according to the first configuration example is provided with the substrate 12, a frame body 77, the plurality of sub-mounts 13, the plurality of light emitting elements 14, a lid body 78 and the plurality of lead terminals 17 (not shown). The substrate 12, the frame body 77 and the lid body 78 are each a separate member, and are bonded to each other.

The substrate 12 is formed of a plate material having the first surface 12a, and the second surface 12b. On the first surface 12a side of the substrate 12, there is disposed the plurality of light emitting elements 14 via the plurality of sub-mounts 13. The substrate 12 is formed of a metal material such as copper or aluminum.

The frame body 77 is disposed so as to surround the plurality of light emitting elements 14, and is bonded on the first surface 12a side of the substrate 12. The frame body 77 has a wall section 77a protruding roughly perpendicularly to the first surface 12a of the substrate 12, and a support section 77b protruding from the upper end of the wall section 77a roughly perpendicularly (roughly in parallel to the first surface 12a of the substrate 12) to the wall section 77a. The support section 77b supports the lid body 78 (a light transmissive member 79). The wall section 77a and the support section 77b are integrated into a single member.

The frame body 77 is formed of an organic resin material including thermoplastic resin such as acrylic resin (PMMA), acrylonitrile-butadiene-styrene resin (ABS), polycarbonate (PC) or liquid crystal polymer (LCP), thermoset resin such as epoxy resin (EP), phenol resin (PF) or thermoset polyimide (PI), or the like.

The lid body 78 is formed of the light transmissive member 79 shaped like a plate. The light transmissive member 79 has a quadrangular shape in the plan view. As the material of the light transmissive member 79, there is used optical glass including borosilicate glass, silica glass or the like, quartz crystal, sapphire or the like. The lid body 78 is bonded on the lower surface of the support section 77b of the frame body 77.

In the first configuration example, the substrate 12 and the frame body 77 are bonded to each other by welding with the organic resin material as the constituent material of the frame body 77. Similarly, the frame body 77 and the lid body 78 (the light transmissive member 79) are bonded to each other by welding with the organic resin material as the constituent material of the frame body 77. It should be noted that the substrate 12 and the frame body 15, and the frame body 15 and the lid body 78 can be bonded to each other with the bonding material including the organic adhesive instead of welding.

Second Configuration Example of Fourth Embodiment

Hereinafter, a second configuration example of the fourth embodiment will be described using FIG. 12.

A light source device according to the second configuration example is substantially the same in basic configuration as that of the first configuration example, but is different in the configuration of the frame body from that of the first configuration example. Therefore, the description of the whole of the light source device will be omitted, and only the configuration different from that of the first configuration example will be described.

Figure 12:
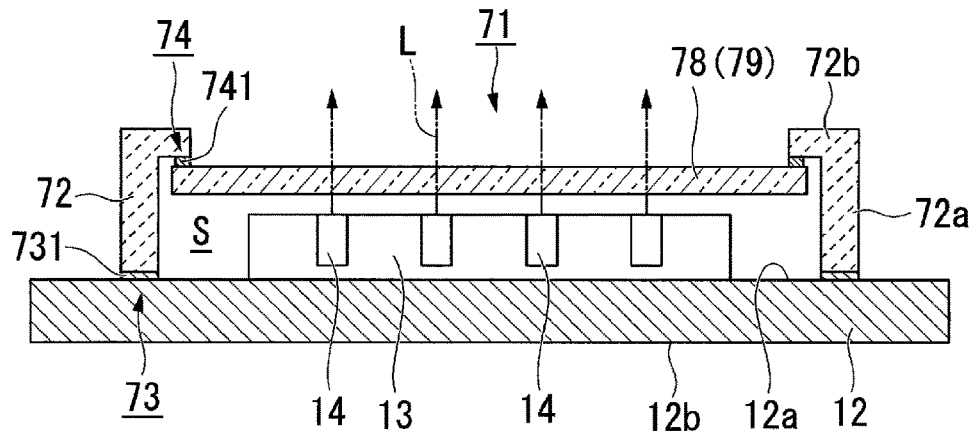
FIG. 12 is a cross-sectional view of a light source device according to a second configuration example of the fourth embodiment.

FIG. 12 is a cross-sectional view of the light source device 71 according to the second configuration example of the fourth embodiment.

In FIG. 12, the constituents common to the drawing used in the embodiments described above are denoted by the same reference symbols, and the description thereof will be omitted.

As shown in FIG. 12, in the light source device 71 according to the second configuration example, the frame body 72 is formed of the material including a ceramic material as a kind of the nonconductive material. As the ceramic material, there is preferably used a ceramic material such as alumina, silicon carbide, or silicon nitride. The frame body 72 has a wall section 72a and a support section 72b.

In a first bonding section 73, the substrate 12 and the frame body 72 are bonded to each other with a bonding material 731 including an organic adhesive. As the organic adhesive, there is preferably used, for example, a silicone-based adhesive, an epoxy resin-based adhesive, or an acrylic resin-based adhesive.

In a second bonding section 74, the frame body 72 and the lid body 78 are bonded to each other with a bonding material 741 including a metal material such as a silver brazing material or gold-tin solder, or an inorganic material such as low-melting-point glass. Alternatively, it is also possible for the frame body 72 and the lid body 78 to be bonded to each other with the bonding material 741 including an organic adhesive similarly to the first bonding section 73.

When manufacturing the light source devices 76, 71 according to the fourth embodiment, since the lid body 78 is bonded to the lower surface of the support section 77b, 72b of the frame body 77, 72, it is not possible to bond the lid body 78 to the frame body 77, 72 after bonding the frame body 77, 72 to the substrate 12. Therefore, unlike the manufacturing process of the first embodiment shown in FIG. 4A through FIG. 4D, the lid body 78 is bonded to the frame body 77, 72, and then, the frame body 77, 72 to which the lid body 78 has been bonded is bonded to the substrate 12 on which the plurality of light emitting elements 14 has already been mounted.

Also in the light source devices 76, 71 according to the fourth embodiment, it is possible to obtain substantially the same advantages in the first embodiment such as the advantage that the device configuration including the terminal extraction structure of the light emitting elements 14 can be simplified, the advantage that productivity of the light source device 76, 71 is enhanced to make it possible to reduce the manufacturing cost, the advantage that simplification of the manufacturing process can be achieved, and the advantage that the reliability of the light source device 76, 71 can be ensured.

In particular, in the light source devices 76, 71 according to the fourth embodiment, since there is used the frame body 77, 72 obtained by integrating the frame body 15 and the support member 55 in the second embodiment shown in FIG. 6 with each other, it is possible to obtain substantially the same advantages as those of the second embodiment while simplifying the device configuration and the manufacturing process compared to the second embodiment.

Fifth Embodiment

Hereinafter, a fifth embodiment of the present disclosure will be described using FIG. 13 and FIG. 14.

A light source device according to the fifth embodiment is substantially the same in basic configuration as that of the first embodiment, but is different in the configuration of the frame body and the lid body from that of the first embodiment. Therefore, the description of the whole of the light source device will be omitted, and only the configuration different from that of the first embodiment will be described.

Figure 13:
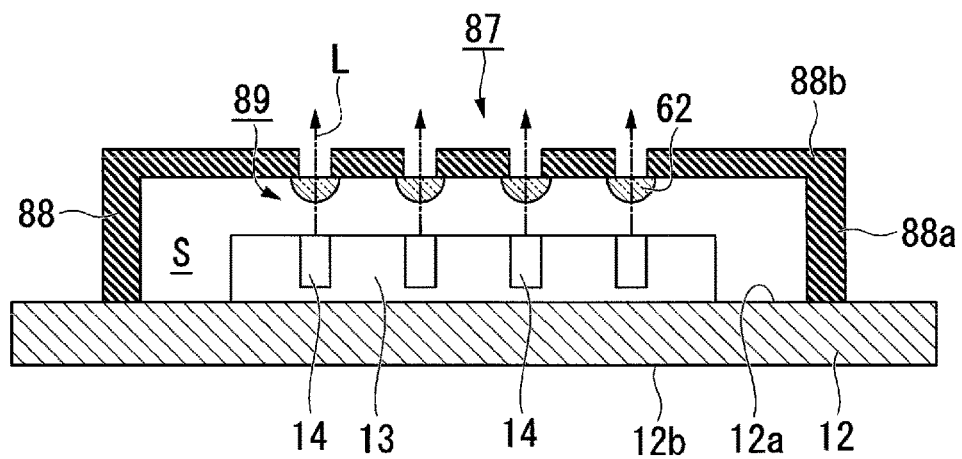
FIG. 13 is a cross-sectional view of a light source device according to a first configuration example of a fifth embodiment.

FIG. 13 is a cross-sectional view of a light source device 87 according to a first configuration example of the fifth embodiment.

In FIG. 13, the constituents common to the drawing used in the first embodiment are denoted by the same reference symbols, and the description thereof will be omitted.

First Configuration Example of Fifth Embodiment

As shown in FIG. 13, the light source device 87 according to the fifth embodiment is provided with the substrate 12, a frame body 88, the plurality of sub-mounts 13, the plurality of light emitting elements 14, a lid body 89 and the plurality of lead terminals 17 (not shown). The substrate 12, the frame body 88 and the lid body 89 are each a separate member, and are bonded to each other.

The substrate 12 is substantially the same as in the first embodiment shown in FIG. 2. Specifically, the substrate 12 is formed of a metal material such as copper or aluminum, and has the first surface 12a and the second surface 12b.

The frame body 88 is disposed so as to surround the plurality of light emitting elements 14, and is bonded on the first surface 12a side of the substrate 12. The frame body 88 has a wall section 88a protruding roughly perpendicularly to the first surface 12a of the substrate 12, and a support section 88b protruding from the upper end of the wall section 88a roughly perpendicularly (roughly in parallel to the first surface 12a of the substrate 12) to the wall section 88a. The support section 88b has a plurality of opening sections, and supports the lid body 89 constituted by the plurality of light transmissive members 62. The wall section 88a and the support section 88b are integrated into a single member.

The frame body 88 is formed of an organic resin material including thermoplastic resin such as acrylic resin (PMMA), acrylonitrile-butadiene-styrene resin (ABS), polycarbonate (PC) or liquid crystal polymer (LCP), thermoset resin such as epoxy resin (EP), phenol resin (PF) or thermoset polyimide (PI), or the like.

The lid body 89 is constituted by the plurality of light transmissive members 62. Each of the light transmissive members 62 is formed of a plano-convex lens. As the light transmissive member 62, there is used optical glass including borosilicate glass, silica glass or the like, quartz crystal, sapphire or the like. Further, it is also possible for each of the light transmissive members 62 to be bonded to a surface (the lower surface in FIG. 13) of the support section 88b opposed to the first surface 12a, or bonded to a surface (the upper surface in FIG. 13) of the support section 88b on the opposite side to the surface opposed to the first surface 12a.

In the first configuration example, the substrate 12 and the frame body 88 are bonded to each other by welding with the organic resin material as the constituent material of the frame body 88. Similarly, the frame body 88 and the lid body 89 (the light transmissive member 62) are bonded to each other by welding with the organic resin material as the constituent material of the frame body 88. It should be noted that the substrate 12 and the frame body 88, and the frame body 88 and the lid body 89 can be bonded to each other with a bonding material including an organic adhesive instead of welding.

Second Configuration Example of Fifth Embodiment

Hereinafter, a second configuration example of the fifth embodiment will be described using FIG. 14.

A light source device according to the second configuration example is substantially the same in basic configuration as that of the first configuration example, but is different in the configuration of the frame body from that of the first configuration example. Therefore, the description of the whole of the light source device will be omitted, and only the configuration different from that of the first configuration example will be described.

Figure 14:
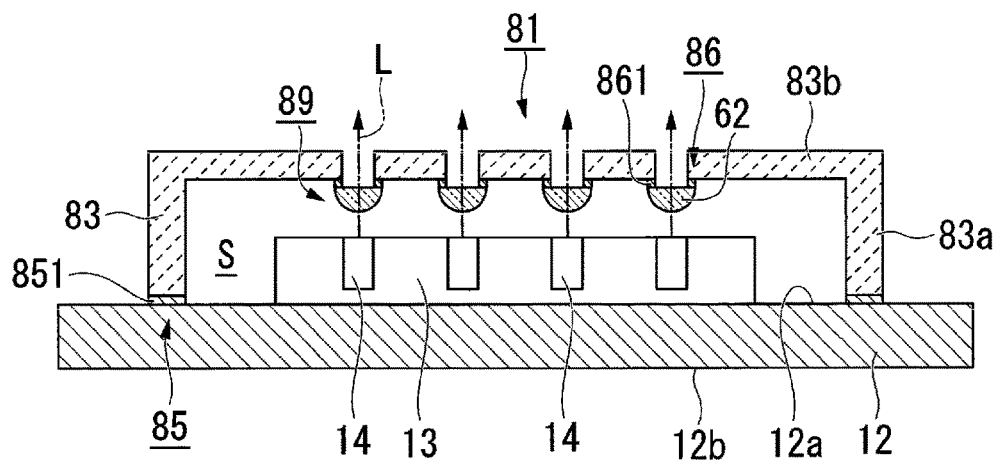
FIG. 14 is a cross-sectional view of a light source device according to a second configuration example of the fifth embodiment.

FIG. 14 is a cross-sectional view of a light source device 81 according to the second configuration example of the fifth embodiment.

In FIG. 14, the constituents common to the drawing used in the embodiments described above are denoted by the same reference symbols, and the description thereof will be omitted.

As shown in FIG. 14, in the light source device 81 according to the second configuration example, the frame body 83 has a wall section 83a protruding roughly perpendicularly to the first surface 12a of the substrate 12, and a support section 83b protruding from the upper end of the wall section 83a roughly perpendicularly (roughly in parallel to the first surface 12a of the substrate 12) to the wall section 83a. The frame body 83 is formed of a material including a ceramic material as a kind of the nonconductive material. As the ceramic material, there is preferably used a ceramic material such as alumina, silicon carbide, or silicon nitride.

In the first bonding section 85, the substrate 12 and the frame body 83 are bonded to each other with a bonding material 851 including an organic adhesive. As the organic adhesive, there is preferably used, for example, a silicone-based adhesive, an epoxy resin-based adhesive, or an acrylic resin-based adhesive.

In a second bonding section 86, the frame body 83 and the lid body 89 are bonded to each other with a bonding material 861 including a metal material such as a silver brazing material or gold-tin solder, or an inorganic material such as low-melting-point glass. Alternatively, it is also possible for the frame body 83 and the lid body 89 to be bonded to each other with the bonding material 851 including an organic adhesive similarly to the first bonding section 85. Similarly to the first configuration example, it is also possible for each of the light transmissive members 62 to be bonded to a surface (the lower surface in FIG. 13) of the support section 83b opposed to the first surface 12a, or bonded to a surface (the upper surface in FIG. 13) of the support section 83b on the opposite side to the surface opposed to the first surface 12a.

When manufacturing the light source devices 87, 81 according to the fifth embodiment, since the plurality of light transmissive members 62 constituting the lid body 89 is bonded to the lower surface of the support section 88b, 83b of the frame body 88, 83, it is not possible to bond the plurality of light transmissive members 62 to the frame body 88, 83 after bonding the frame body 88, 83 to the substrate 12. Therefore, unlike the manufacturing process of the first embodiment shown in FIG. 4A through FIG. 4D, the plurality of light transmissive members 62 is bonded to the frame body 88, 83, and then, the frame body 88, 83 to which the plurality of light transmissive members 62 has been bonded is bonded to the substrate 12 on which the plurality of light emitting elements 14 has already been mounted.

Also in the light source devices 87, 81 according to the fifth embodiment, it is possible to obtain substantially the same advantages in the first embodiment such as the advantage that the device configuration including the terminal extraction structure of the light emitting elements 14 can be simplified, the advantage that productivity of the light source device 87, 81 is enhanced to make it possible to reduce the manufacturing cost, the advantage that simplification of the manufacturing process can be achieved, and the advantage that the reliability of the light source device 87, 81 can be ensured.

In particular, in the light source devices 87, 81 according to the fifth embodiment, since there is used the frame body 88, 83 obtained by integrating the frame body 15 and the support member 63 in the third embodiment shown in FIG. 9 with each other, it is possible to obtain substantially the same advantages as those of the third embodiment while simplifying the device configuration and the manufacturing process compared to the third embodiment.

Sixth Embodiment

Hereinafter, a sixth embodiment of the present disclosure will be described using FIG. 15 through FIG. 17.

A light source device according to the sixth embodiment is substantially the same in basic configuration as that of the first embodiment, but is different in the configuration of the frame body and the lid body from that of the first embodiment. Therefore, the description of the whole of the light source device will be omitted, and only the configuration different from that of the first embodiment will be described.

Figure 15:
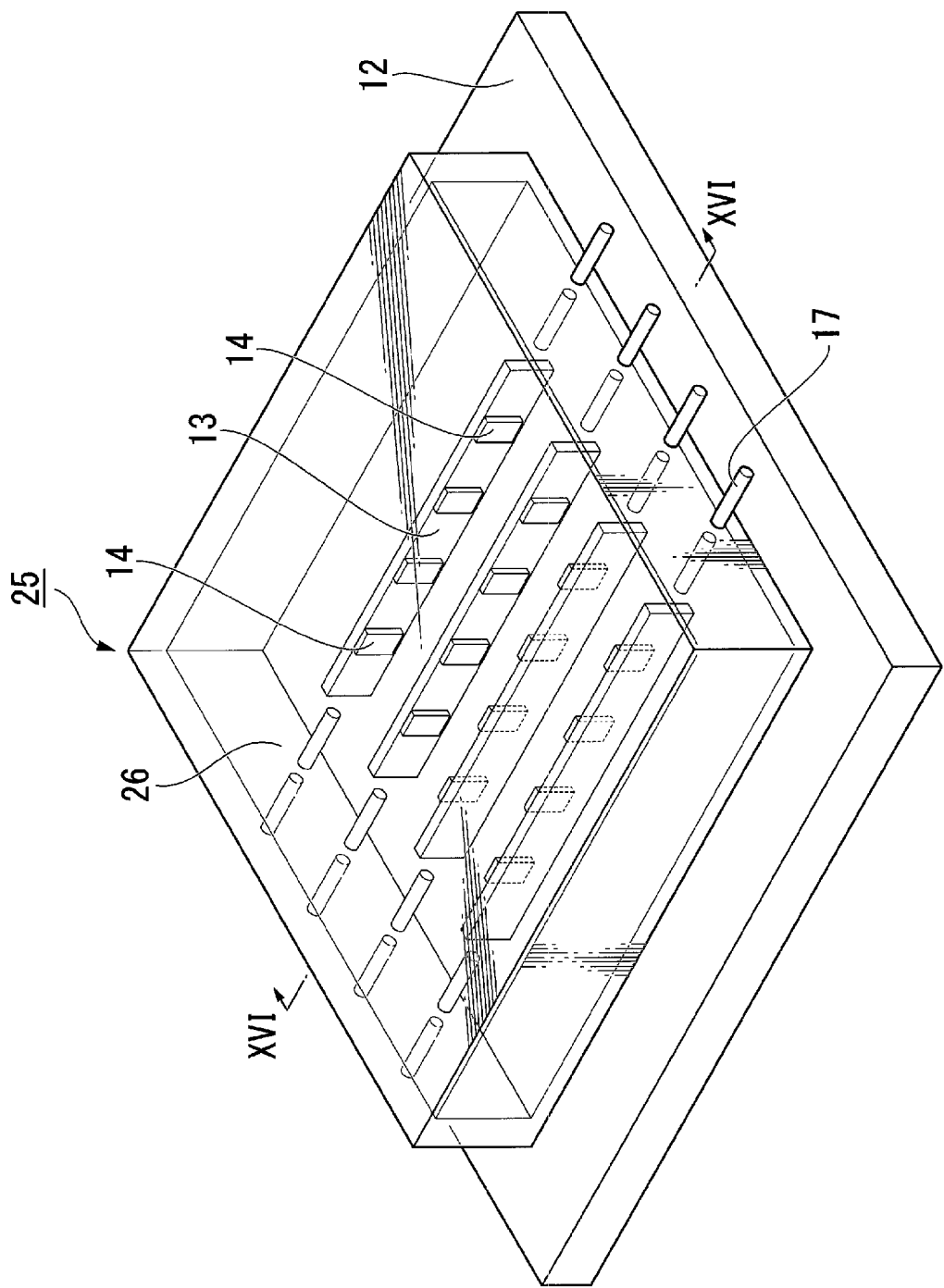
FIG. 15 is a perspective view of a light source device according to a first configuration example of a sixth embodiment.

FIG. 15 is a perspective view of a light source device 25 according to a first configuration example of the sixth embodiment. FIG. 16 is a cross-sectional view of the light source device 25 along the line XVI-XVI shown in FIG. 15.

Figure 16:
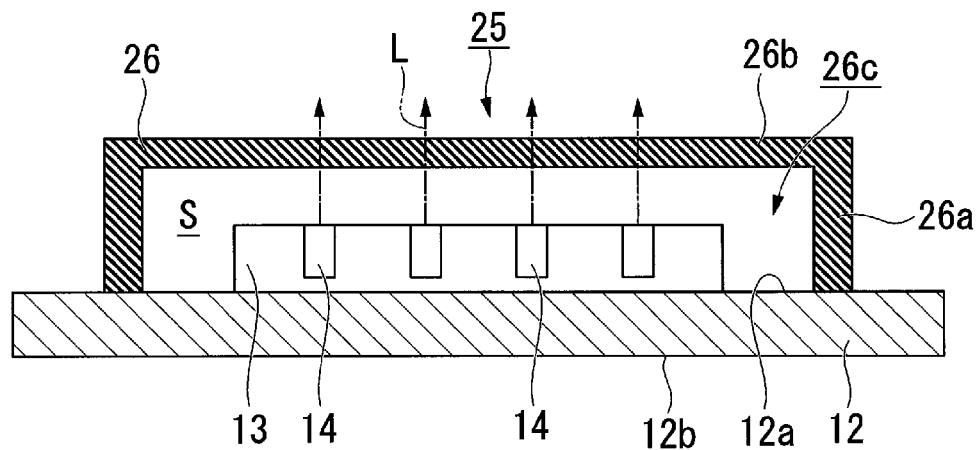
FIG. 16 is a cross-sectional view of the light source device along the line XVI-XVI shown in FIG. 15.

In FIG. 15 and FIG. 16, the constituents common to the drawings used in the first embodiment are denoted by the same reference symbols, and the description thereof will be omitted.

First Configuration Example of Sixth Embodiment

As shown in FIG. 15 and FIG. 16, the light source device 25 according to the first configuration example is provided with the substrate 12, the plurality of sub-mounts 13, the plurality of light emitting elements 14, a light transmissive member 26 and the plurality of lead terminals 17.

The substrate 12 is formed of a plate material having the first surface 12a, and the second surface 12b. On the first surface 12a side of the substrate 12, there is disposed the plurality of light emitting elements 14 via the plurality of sub-mounts 13. The substrate 12 is formed of a metal material such as copper or aluminum.

The light transmissive member 26 has a side wall section 26a protruding roughly perpendicularly to the first surface 12a of the substrate 12, and an upper wall section 26b extending from the upper end of the side wall section 26a roughly perpendicularly (roughly in parallel to the first surface 12a of the substrate 12) to the side wall section 26a. As described above, the light transmissive member 26 is a member shaped like a rectangular solid box with one of the six sides opened. The light transmissive member 26 is bonded on the first surface 12a side of the substrate 12 with the open side facing to the first surface 12a of the substrate 12 so as to cover the plurality of light emitting elements 14. In other words, the light transmissive member 26 has a recessed section 26c for covering the plurality of light emitting elements 14.

The light transmissive member 26 is formed of an organic resin material including thermoplastic resin such as acrylic resin (PMMA), acrylonitrile-butadiene-styrene resin (ABS), polycarbonate (PC) or liquid crystal polymer (LCP), thermoset resin such as epoxy resin (EP), phenol resin (PF) or thermoset polyimide (PI), or the like. In other words, the light transmissive member 26 is formed of a material including a nonconductive material.

The substrate 12 and the light transmissive member 26 are bonded to each other by welding with the organic resin material as the constituent material of the light transmissive member 26. It should be noted that the substrate 12 and the light transmissive member 26 can be bonded to each other with a bonding material including an organic adhesive instead of welding.

Second Configuration Example of Sixth Embodiment

Hereinafter, a second configuration example of the sixth embodiment will be described using FIG. 17.

A light source device according to the second configuration example is substantially the same in basic configuration as that of the first configuration example, but is different in the configuration of the light transmissive member from that of the first configuration example. Therefore, the description of the whole of the light source device will be omitted, and only the configuration different from that of the first configuration example will be described.

Figure 17:
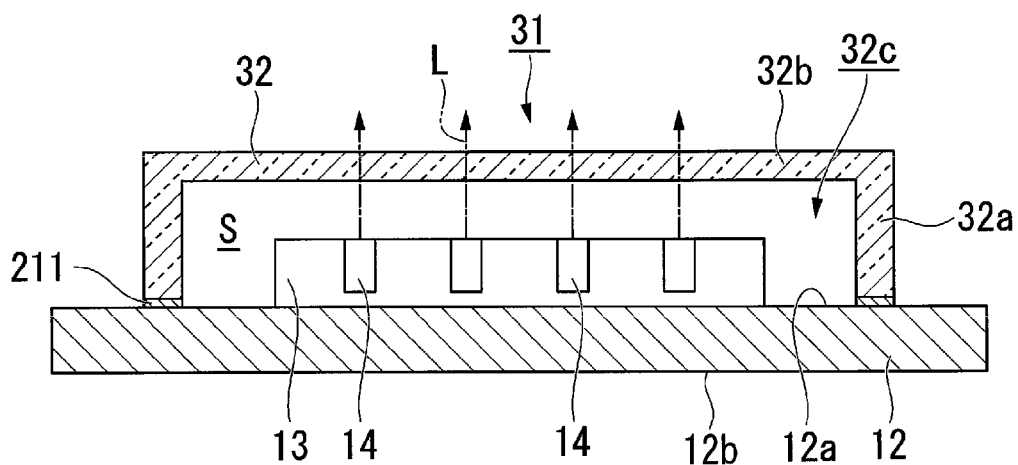
FIG. 17 is a cross-sectional view of a light source device according to a second configuration example of the sixth embodiment.

FIG. 17 is a cross-sectional view of the light source device 31 according to the second configuration example of the sixth embodiment.

In FIG. 17, the constituents common to the drawing used in the embodiments described above are denoted by the same reference symbols, and the description thereof will be omitted.

As shown in FIG. 17, in the light source device 31 according to the second configuration example, a light transmissive member 32 is formed of a material including a ceramic material as a kind of the nonconductive material. As the ceramic material, there is preferably used a ceramic material such as alumina, silicon carbide, or silicon nitride. The light transmissive member 32 has a side wall section 32a, an upper wall section 32b, and a recessed section 32c for covering the plurality of light emitting elements 14.

The substrate 12 and the light transmissive member 32 are bonded to each other with the bonding material 211 including an organic adhesive. As the organic adhesive, there is preferably used, for example, a silicone-based adhesive, an epoxy resin-based adhesive, or an acrylic resin-based adhesive.

When manufacturing the light source devices 25, 31 according to the sixth embodiment, the plurality of light emitting elements 14 is mounted on the first surface 12a of the substrate 12 via the sub-mounts 13, and then, the light transmissive member 26, 32 is bonded to the first surface 12a of the substrate 12 so as to cover the plurality of light emitting elements 14. When bonding the light transmissive member 26, 32, welding or the bonding material described above is used.

Also in the light source devices 25, 31 according to the sixth embodiment, it is possible to obtain substantially the same advantages in the first embodiment such as the advantage that the device configuration including the terminal extraction structure of the light emitting elements 14 can be simplified, the advantage that productivity of the light source device 25, 31 is enhanced to make it possible to reduce the manufacturing cost, the advantage that simplification of the manufacturing process can be achieved, and the advantage that the reliability of the light source device 25, 31 can be ensured.

In particular, in the case of the sixth embodiment, since there is used the light transmissive member 26, 32 having the lid body for covering the plurality of light emitting elements 14 and the frame body integrated with each other, it is possible to further simplify the device configuration and the manufacturing process. Further, since the number of the bonding sections between the different members can be made the smallest of all of the embodiments, it is possible to reduce the possibility of the degradation of the reliability due to a defect in the bonding section or the like.

MODIFIED EXAMPLES

Some modified examples common to the light source devices according to two or more of the first through sixth embodiments described above will hereinafter be described. The constituents common to the drawings related to the following modified examples and the drawings used in the embodiments described above are denoted by the same reference symbols, and the description thereof will be omitted.

First Modified Example

Figure 18:
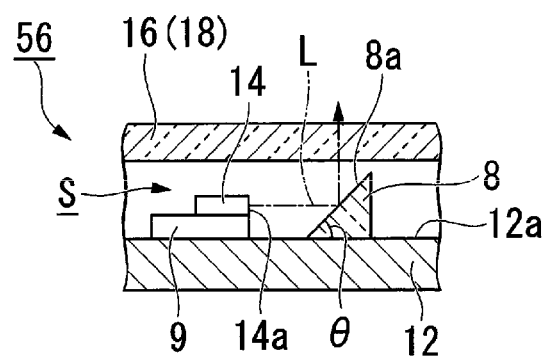
FIG. 18 is a cross-sectional view of a substantial part of a light source device according to a first modified example.

FIG. 18 is a cross-sectional view of a substantial part of a light source device 56 according to a first modified example.

As shown in FIG. 18, the light source device 56 according to the first modified example is further provided with a prism 8 disposed on the first surface 12a of the substrate 12. The light emitting element 14 is disposed on the first surface 12a side of the substrate 12 via a sub-mount 9. The light emitting element 14 is disposed on the sub-mount 9 so that the light emission surface 14a out of a plurality of surfaces of the light emitting element 14 is roughly perpendicular to the first surface 12a of the substrate 12. According to this arrangement, each of the light emitting elements 14 emits the light L in a direction roughly parallel to the first surface 12a of the substrate 12.

The prism 8 is disposed on the light path of the light L emitted from the light emitting element 14 corresponding to the prism 8. The prism 8 can be disposed individually so as to correspond to each of the light emitting elements 14, or can also be disposed commonly to the plurality of light emitting elements 14 mounted on one sub-mount 9.

The cross-sectional shape of the prism 8 cut by a plane parallel to the emission direction of the light and perpendicular to the first surface 12a of the substrate 12 takes on a roughly triangular shape. The prism 8 has a reflecting surface 8a for reflecting the light L emitted from the light emitting element 14 toward a direction roughly perpendicular to the first surface 12a of the substrate 12. The reflecting surface 8a is tilted with respect to the first surface 12a of the substrate 12, and the angle θ formed between the reflecting surface 8a and the first surface 12a of the substrate 12 is, for example, 45°. The light L emitted from the light emitting element 14 is reflected by the reflecting surface 8a of the prism 8 to change the proceeding direction, and is taken out to the outside via the light transmissive member 18.

It should be noted that in the first modified example, it is possible for a condenser lens to be disposed on the upper surface (the surface on the opposite side to the housing space S) of the light transmissive member 18 integrally with the light transmissive member 18.

The configuration of the first modified example can be applied to all of the light source devices according to the first through sixth embodiments.

Second Modified Example

Figure 19:
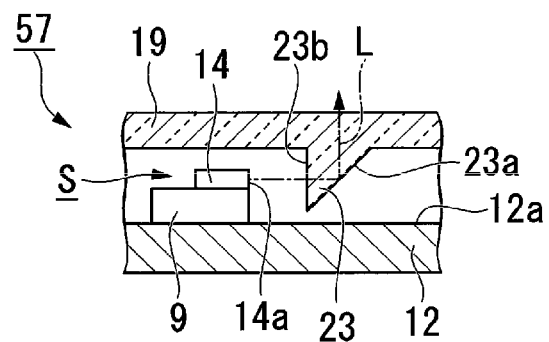
FIG. 19 is a cross-sectional view of a substantial part of a light source device according to a second modified example.

FIG. 19 is a cross-sectional view of a substantial part of a light source device 57 according to a second modified example.

As shown in FIG. 19, the light source device 57 according to the second modified example is further provided with a prism 23 disposed on a surface of a light transmissive member 19 opposed to the first surface 12a of the substrate 12. Similarly to the first modified example, the light emitting element 14 is disposed on the sub-mount 9 so that the light emission surface 14a is roughly perpendicular to the first surface 12a of the substrate 12. According to this arrangement, each of the light emitting elements 14 emits the light L in a direction roughly parallel to the first surface 12a of the substrate 12.

The cross-sectional shape of the prism 23 cut by a plane parallel to the emission direction of the light L and perpendicular to the first surface 12a of the substrate 12 takes on a roughly triangular shape. The prism 23 has a plane of incidence 23b which the light L emitted from the light emitting element 14 enters, and a reflecting surface 23a for reflecting the light L toward a direction roughly perpendicular to the first surface 12a of the substrate 12. The reflecting surface 23a is tilted with respect to the first surface 12a of the substrate 12, and the angle formed between the reflecting surface 23a and the first surface 12a of the substrate 12 is, for example, 45°. The light L emitted from the light emitting element 14 enters the prism 23, and is then reflected by the reflecting surface 23a to change the proceeding direction, and is taken out to the outside.

It should be noted that in the second modified example, it is possible for a condenser lens to be disposed on the upper surface (the surface on the opposite side to the housing space S) of the light transmissive member 19 integrally with the light transmissive member 19.

The configuration of the second modified example can be applied to the light source devices according to the first embodiment, the second embodiment, the fourth embodiment and the sixth embodiment.

Third Modified Example

Figure 20:
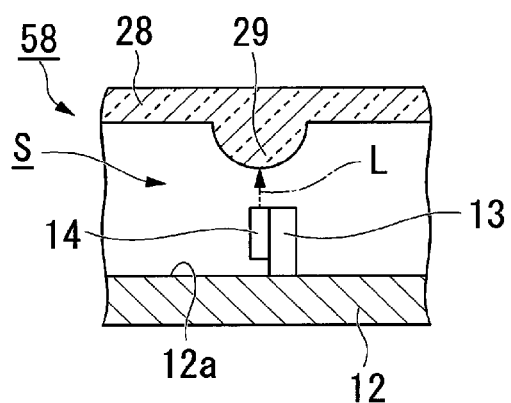
FIG. 20 is a cross-sectional view of a substantial part of a light source device according to a third modified example.

FIG. 20 is a cross-sectional view of a substantial part of a light source device 58 according to a third modified example.

As shown in FIG. 20, the light source device 58 according to the third modified example is further provided with a lens 29 disposed on a surface of a light transmissive member 28 opposed to the first surface 12a of the substrate 12. Similarly to the first embodiment, the light emitting element 14 is disposed on the sub-mount 13 so that the light emission surface 14a becomes roughly parallel to the first surface 12a of the substrate 12. According to this arrangement, each of the light emitting elements 14 emits light L in a direction roughly perpendicular to the first surface 12a of the substrate 12.

The lens 29 is disposed on the light path of the light L emitted from the light emitting element 14 corresponding to the lens 29. The light L emitted from the light emitting element 14 is transmitted through the lens 29, and thus, taken out to the outside in a converged state.

It should be noted that in the third modified example, it is possible to dispose a lens (a convex lens protruding toward the opposite side to the housing space S) on the upper surface (a surface on the opposite side to the housing space S) of the light transmissive member 28 integrally with the light transmissive member 28.

The configuration of the third modified example can be applied to the light source devices according to the first embodiment, the second embodiment, the fourth embodiment and the sixth embodiment.

Fourth Modified Example

Figure 21:
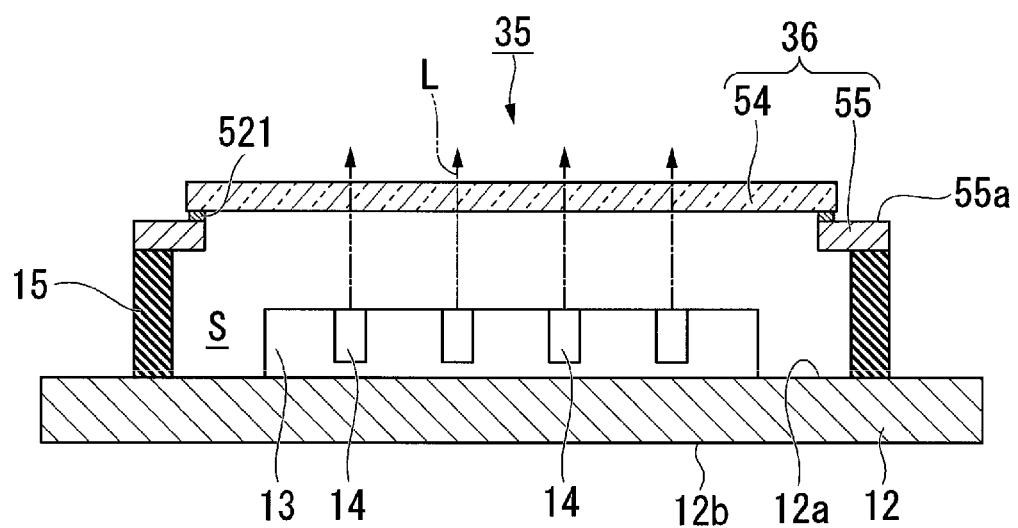
FIG. 21 is a cross-sectional view of a light source device according to a fourth modified example.

FIG. 21 is a cross-sectional view of a light source device according to a fourth modified example.

As shown in FIG. 21, in the light source device according to the fourth modified example, the light transmissive member 54 constituting a lid body 36 is bonded to the surface 55a (the upper surface in FIG. 21) on the opposite side to a surface opposed to the first surface 12a of the substrate 12 out of two surfaces of the support member 55. In other words, the light transmissive member 54 is bonded to the support member 55 outside the housing space S.

The frame body 15 is bonded to the first surface 12a of the substrate 12 by welding. It should be noted that the frame body 15 can also be bonded to the first surface 12a of the substrate 12 with a bonding material. Similarly to the second embodiment or the like, the light transmissive member 54 and the support member 55 can be bonded to each other by welding, or can also be bonded to each other via a bonding material including an organic adhesive.

The configuration of the fourth modified example can be applied to the light source devices according to the second embodiment, the third embodiment, the fourth embodiment and the fifth embodiment.

Fifth Modified Example

Figure 22:
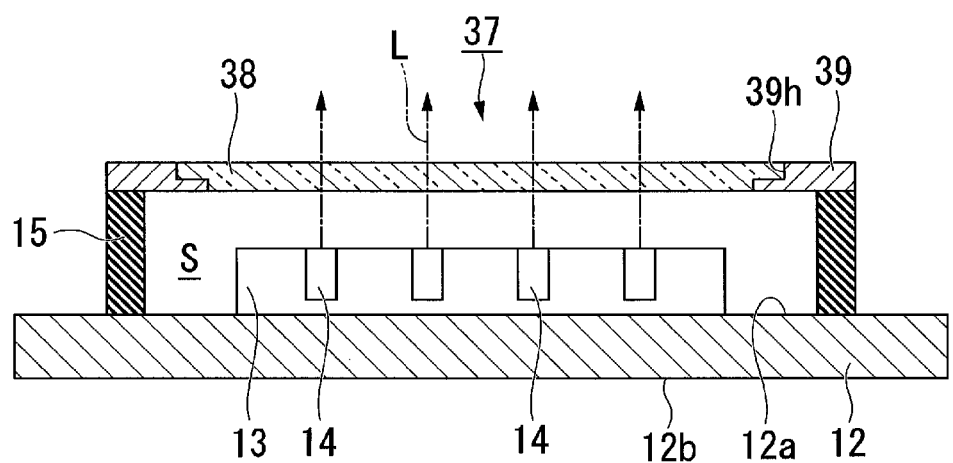
FIG. 22 is a cross-sectional view of a light source device according to a fifth modified example.

FIG. 22 is a cross-sectional view of a light source device according to a fifth modified example.

As shown in FIG. 22, in the light source device according to the fifth modified example, a light transmissive member 38 is bonded in a configuration in which the light transmissive member 38 is fitted into an opening section 39h of a support member 39.

Bonding surfaces to be bonded to each other of the respective light transmissive member 38 and the support member 39 can be bonded to each other with a bonding material including a metal material such as a silver brazing material or gold-tin solder, or an inorganic material such as low-melting-point glass, or can also be formed of a bonding material including an organic adhesive. It is possible to adopt a configuration in which the light transmissive member 38 is fitted into a stepped part of the support member 39 as shown in FIG. 22, and the shape of the bonding section can arbitrarily be changed.

The configuration of the fifth modified example can be applied to the light source devices according to the second embodiment, the third embodiment, the fourth embodiment and the fifth embodiment.

Sixth Modified Example

In the embodiments described above, the lead terminals penetrating the frame body are adopted as measures for extracting the interconnections connected to the connection terminals of the respective light emitting elements outside the housing space. Instead of this configuration, it is also possible to adopt interconnection layers disposed on the first surface of the substrate.

The configuration of the sixth modified example can be applied to all of the light source devices according to the first through sixth embodiments.

First Configuration Example

Figure 23:
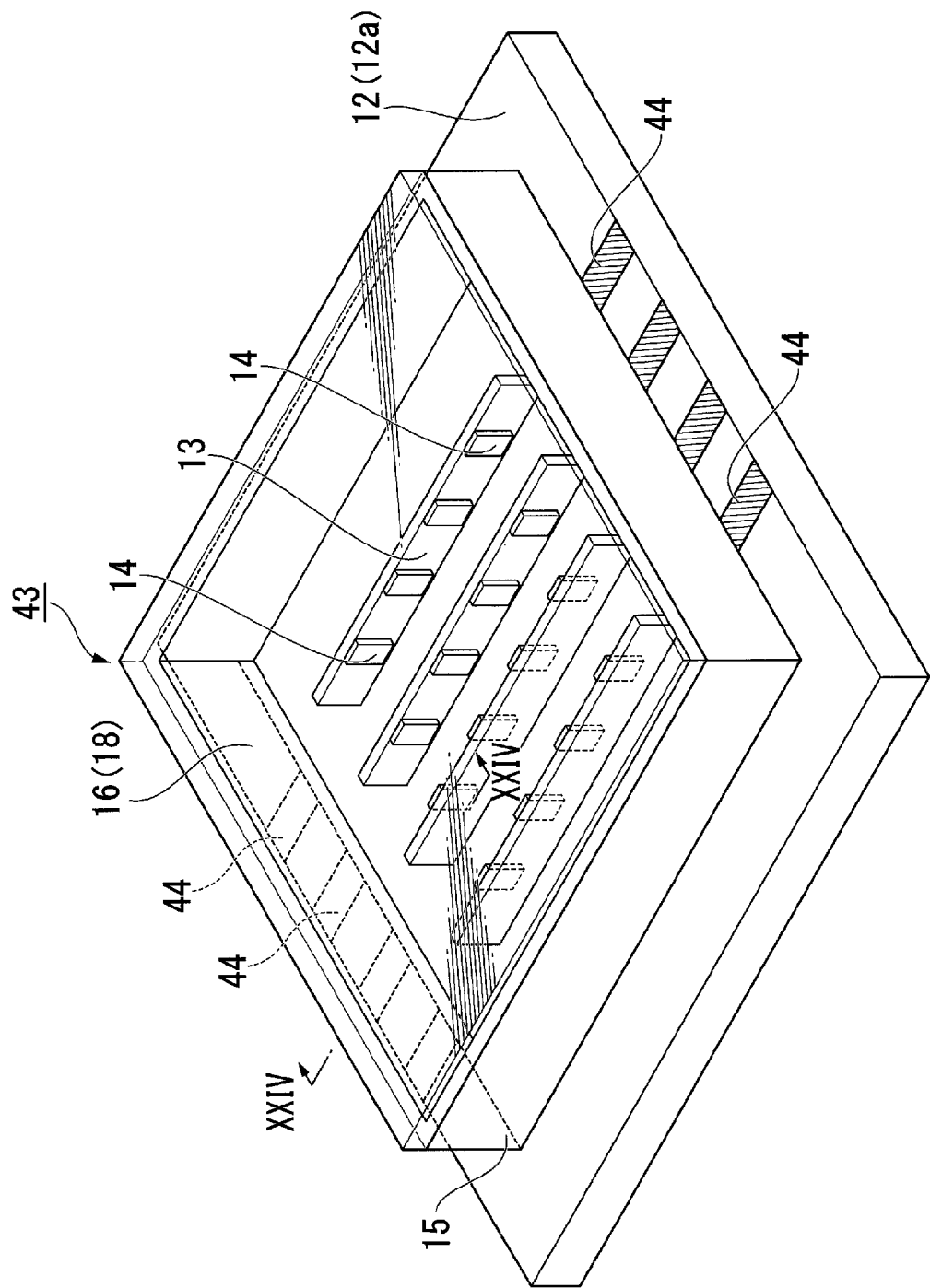
FIG. 23 is a perspective view of a light source device according to a first configuration example of a sixth modified example.

FIG. 23 is a perspective view of a light source device 43 according to a first configuration example of the sixth modified example.

Figure 24:
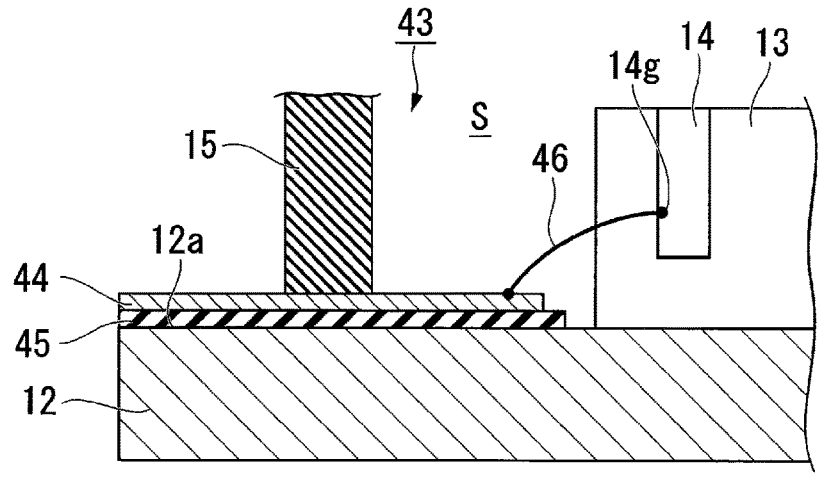
FIG. 24 is a cross-sectional view of a substantial part of the light source device along the line XXIV-XXIV shown in FIG. 23.

FIG. 24 is a cross-sectional view of a substantial part of the light source device 43 along the line XXIV-XXIV shown in FIG. 23.

As shown in FIG. 23, in the light source device 43 according to the sixth modified example, the plurality of light emitting elements 14 mounted on one sub-mount 13 is connected in series to each other, and a pair of interconnection layers 44 are disposed on the lateral sides of each of the sub-mounts 13 on the first surface 12a of the substrate 12. It should be noted that the electrical connection of the plurality of light emitting elements 14 and the arrangement of the interconnection layers 44 are not limited to this example, but can arbitrarily be modified.

As shown in FIG. 24, the frame body 15 is bonded to the first surface 12a of the substrate 12 via an insulating layer 45 and the interconnection layers 44. The frame body 15 is formed of an organic resin material as a kind of the nonconductive material. The frame body 15 is bonded to the interconnection layers 44 by welding.

The insulating layer 45 is disposed on the first surface 12a of the substrate 12. The insulating layer 45 can be formed of an inorganic film, or can also be formed of an organic film. The interconnection layers 44 are disposed on a surface of the insulating layer 45 on the opposite side to the substrate 12. The interconnection layers 44 are disposed below the frame body 15 continuously from the inside to the outside of the housing space S. The interconnection layers 44 are each formed of a metal film made of copper or the like formed by, for example, a plating method. Connection terminals 14g of the light emitting elements 14 and the interconnection layers 44 are electrically connected to each other with bonding wires 46, respectively.

It should be noted that although the insulating layer 45 is indispensable in the case in which the substrate 12 is formed of an electrically conductive material such as copper or aluminum, the insulating layer 45 is not required to be disposed in the case in which the substrate 12 is formed of a nonconductive material.

In the light source device 43 according to the first configuration example, since the frame body 15 is formed of the organic resin material, namely an insulating material, there is no chance for the plurality of interconnection layers 44 to be shorted to each other via the frame body 15 even in the case in which the frame body 15 has direct contact with the interconnection layers 44. Therefore, there is no chance of using a configuration of, for example, further covering the upper surfaces of the interconnection layers 44 with another insulating layer. Thus, it is possible to adopt the interconnection extraction structure with the interconnection layers 44 without complicating the device configuration and the manufacturing process.

Second Configuration Example

Figure 25:
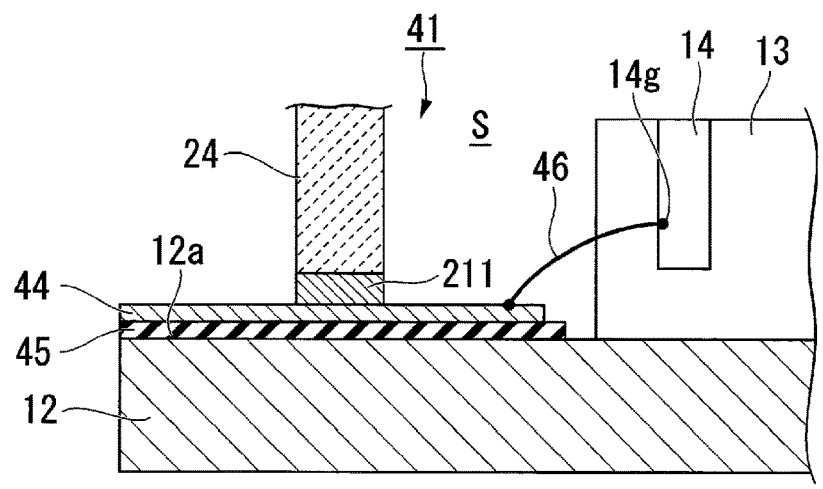
FIG. 25 is a perspective view of a light source device according to a second configuration example of the sixth modified example.

FIG. 25 is a cross-sectional view of a substantial part of a light source device 41 according to a second configuration example of the sixth modified example.

As shown in FIG. 25, in the light source device 41 according to the second configuration example, the frame body 24 is formed of the ceramic material as a kind of the nonconductive material. The frame body 24 is bonded to the interconnection layers 44 via the bonding material 211 including the organic adhesive. The rest of the configuration of the light source device 41 is substantially the same as in the first configuration example.

In the light source device 41 according to the second configuration example, since the frame body 24 is bonded to the interconnection layers 44 via the bonding material 211 including the organic adhesive, the frame body 24 and the interconnection layers 44 are insulated from each other by the bonding material 211, and there is no chance for the interconnection layers 44 to be shorted to each other. Therefore, there is no chance of using a configuration of, for example, further covering the upper surfaces of the interconnection layers 44 with another insulating layer. Thus, it is possible to adopt the interconnection extraction structure with the interconnection layers 44 without complicating the device configuration and the manufacturing process.

Seventh Modified Example

Figure 26:
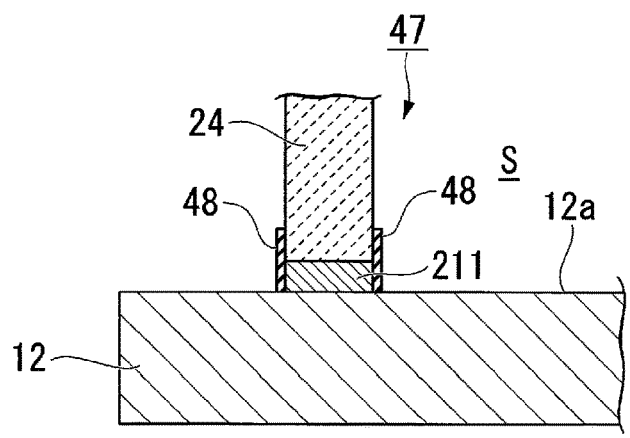
FIG. 26 is a cross-sectional view of a substantial part of a light source device according to a seventh modified example.

FIG. 26 is a cross-sectional view of a substantial part of a light source device 47 according to a seventh modified example.

As shown in FIG. 26, in the light source device 47 according to the seventh modified example, the frame body is formed of the ceramic material as a kind of the nonconductive material. The substrate 12 and the frame body 24 are bonded to each other with the bonding material 211 including the organic adhesive. On the side surface of the bonding material 211 corresponding to the inside of the housing space S, and on the side surface of the bonding material 211 corresponding to the outside of the housing space S, there are respectively disposed gas barrier layers 48. It is also possible for the gas barrier layer 48 to be disposed on either one of the side surfaces of the bonding material 211. Further, it is also possible for the gas barrier layer 48 to be disposed not only on the side surfaces of the bonding material 211, but also continuously on the side surfaces of the frame body 24.

Further, in the case in which the frame body is formed of an organic resin material, it is also possible for the gas barrier layer 48 to be disposed on at least one of the side surface of the bonding material 211 corresponding to the inside of the housing space S and the side surface of the bonding material 211 corresponding to the outside of the housing space S with respect to the frame body.

The gas barrier layer 48 can be formed of a gas barrier coating material known to the public. Alternatively, as the gas barrier layer 48, it is possible to use a thin film as an inorganic film made of, for example, SiN, SiO, $Al_2O_3$, or $HfO_2$, or a metal film made of Cr, Ni, Al or the like deposited by, for example, a CVD method or a PVD method. It should be noted that it is desirable for the metal film described above to be deposited by the CVD method. Further, it is possible to use a thermoplastic resin material for the gas barrier layer 48. In this case, it is possible to improve the gas barrier property by adding an inorganic filler material such as montmorillonite or mica to the thermoplastic resin material. It is desirable to use an inorganic filler material forming flakes.

In the light source device 47 according to the seventh modified example, since the gas barrier layers 48 are disposed on both of the side surfaces of the bonding material 211, it is possible to keep the airtightness in the housing space S. Further, outgas generated from the organic adhesive is prevented from being leaked inside the housing space S, and thus, it is possible to prevent a harmful influence on the light emitting elements 14. From this point of view, a solventless organic adhesive little in outgas is preferably used for each of the bonding sections.

Further, it is also possible for the gas barrier layer 48 to be disposed on any of the side surfaces of the bonding material for bonding the frame body and the light transmissive member to each other, the bonding material for bonding the frame body and the support member to each other, and the bonding material for bonding the support member and the light transmissive member to each other.

Further, it is possible to dispose a light reflecting layer on the side surface of the frame body 15 facing the housing space S. As the material of the light reflecting layer, it is possible to use a thin film as a dielectric multilayer film including, for example, $SiO_2$, $Al_2O_3$, $TiO_3$ or $MgF_2$, or a metal film made of Ni, Ag, Al or the like deposited by, for example, a CVD method or a PVD method. Further, it is also possible to use the dielectric multilayer film and the metal film described above in combination. Thus, it is also possible to reinforce the reflection characteristic. Further, it is possible for the gas barrier layers 48 to be provided with a light diffusion property. In this case, the gas barrier layers 48 also function as light reflecting layers.

In the case in which the light reflecting layer is disposed on the side surface of the frame body 15 facing the housing space S, it is possible to prevent the organic resin material constituting the frame body 15 from deteriorating due to the irradiation with the light L emitted from the light emitting elements 14 on the frame body 15.

Further, in order to prevent the deterioration of the frame body 15 due to the light L, it is also possible to dispose a light absorbing layer on the first surface 12a of the substrate 12. In the case in which the light absorbing layer is disposed on the first surface 12a of the substrate 12, it is possible to suppress diffused reflection of the light L on the first surface 12a of the substrate 12. Further, it is also possible for the light absorbing layer to be disposed on an area other than the area where the light L passes in the surface of the lid body opposed to the first surface 12a of the substrate 12.

The configuration of the seventh modified example can be applied to all of the light source devices according to the first through sixth embodiments.

Seventh Embodiment: Projector

Although an example of a projector according to a seventh embodiment will hereinafter be described, the embodiment of the projector is not limited to this example.

Figure 27:
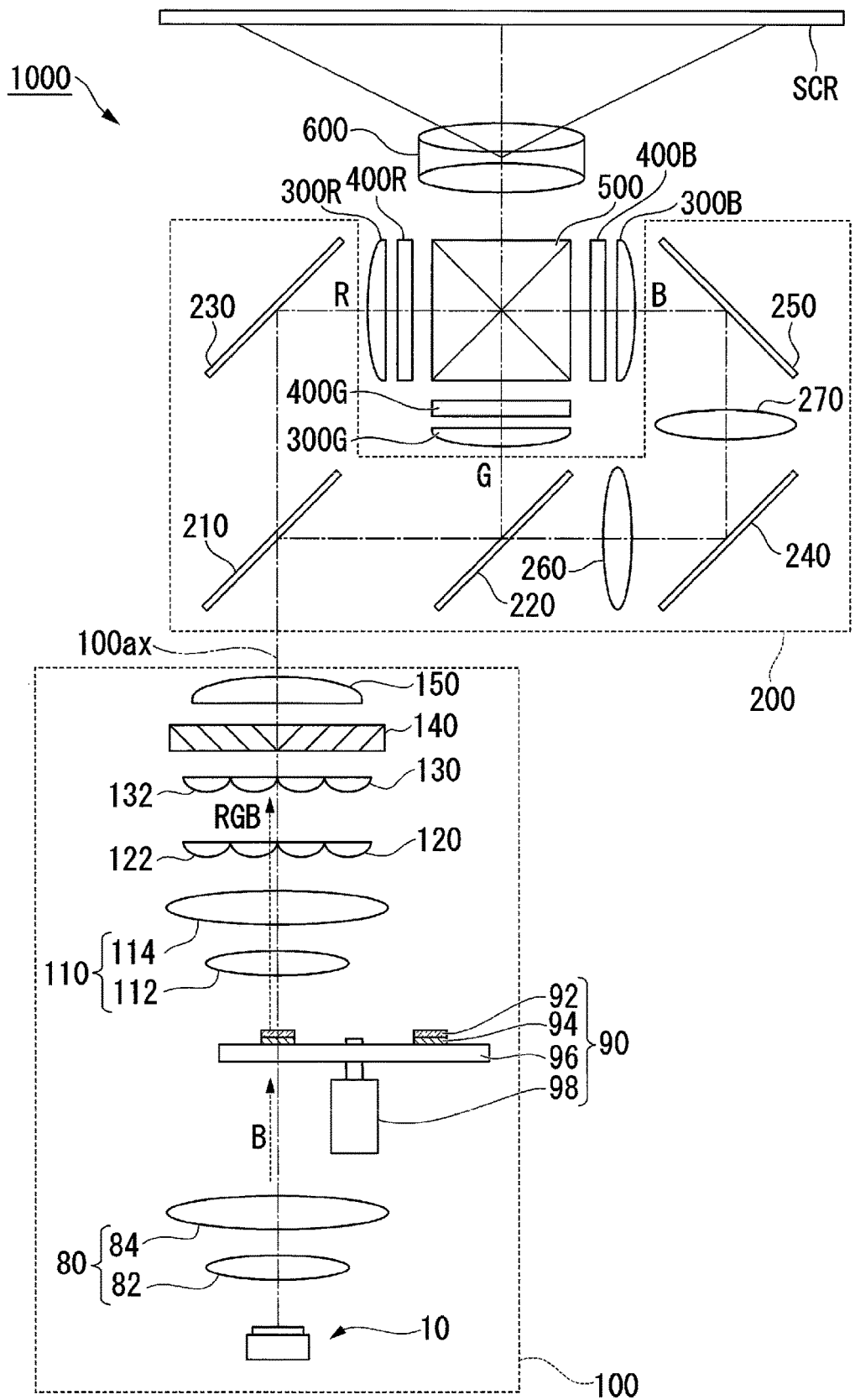
FIG. 27 is a schematic configuration diagram of a projector according to a seventh embodiment.

FIG. 27 is a schematic configuration diagram of the projector 1000 according to the seventh embodiment.

As shown in FIG. 27, the projector 1000 is provided with an illumination device 100, a color separation light guide optical system 200, three liquid crystal light valves 400R, 400G, and 400B as light modulation devices, a cross dichroic prism 500, and a projection optical device 600.

The illumination device 100 is provided with a light source device 10, a light collection optical system 80, a wavelength conversion element 90, a collimating optical system 110, a first lens array 120, a second lens array 130, a polarization conversion element 140, and a superimposing lens 150.

As the light source device 10, it is possible to use any one of the light source devices according to the embodiments described above. The light source device 10 emits, for example, blue light B toward the light collection optical system 80.

The light collection optical system 80 is provided with a first lens 82 and a second lens 84. The light collection optical system 80 is disposed in the light path from the light source device 10 to the wavelength conversion element 90, and makes the blue light B enter a wavelength conversion layer 92 described later in a roughly collected state as a whole. The first lens 82 and the second lens 84 are each formed of a convex lens.

The wavelength conversion element 90 is a so-called transmissive wavelength conversion element, and is formed of the single wavelength conversion layer 92 disposed in a part of a substrate 96 which has a circular shape, and which can be rotated by an electric motor 98, continuously along the circumferential direction of the substrate 96. The wavelength conversion element 90 converts the blue light B into yellow fluorescence including red light R and green light G, and then emits the fluorescence toward the opposite side to the side which the blue light B enters.

The substrate 96 is made of a material for transmitting the blue light B. As the material of the substrate 96, there can be used, for example, silica glass, quartz crystal, sapphire, optical glass, and transparent resin.

The blue light B from the light source device 10 enters the wavelength conversion element 90 from the substrate 96 side. The wavelength conversion layer 92 is formed on the substrate 96 via a dichroic film 94 for transmitting the blue light B and reflecting the red light R and the green light G. The dichroic film 94 is formed of, for example, a dielectric multilayer film.

The wavelength conversion layer 92 converts a part of the blue light B having the wavelength of about 445 nm emitted from the light source device 10 into the fluorescence, and then emits the fluorescence, and at the same time, transmits the remaining part of the blue light B without converting. In other words, the wavelength conversion layer 92 is excited by the light emitted from the light source device 10 to emit the fluorescence. As described above, it is possible to obtain the desired colored light using the light source device 10 for emitting the excitation light and the wavelength conversion layer 92. The wavelength conversion layer 92 is formed of a layer including, for example, $(Y, Gd)_3(Al, Ga)_5O_{12}:Ce$ as an example of a YAG phosphor, and an organic binder.

The collimating optical system 110 is provided with a first lens 112 and a second lens 114. The collimating optical system 110 roughly collimates the light from the wavelength conversion element 90. The first lens 112 and the second lens 114 are each formed of a convex lens.

The first lens array 120 divides the light from the collimating optical system 110 into a plurality of partial light beams. The first lens array 120 is formed of a plurality of first lenses 122 arranged in a matrix in a plane perpendicular to an illumination light axis 100ax.

The second lens array 130 is formed of a plurality of second lenses 132 arranged in a matrix in a plane perpendicular to the illumination light axis 100ax. The plurality of second lenses 132 is disposed corresponding to the plurality of first lenses 122 of the first lens array 120. The second lens array 130 images the image of each of the first lenses 122 of the first lens array 120 in the vicinity of each of the image forming areas of the liquid crystal light valves 400R, 400G, and 400B in cooperation with the superimposing lens 150.

The polarization conversion element 140 is a polarization conversion element for converting each of the partial beams divided into by the first lens array 120 into substantially unique linearly polarized light having a uniform polarization direction, and emitting the resulted partial light beams. The polarization conversion element 140 has a polarization separation layer, a reflecting layer, and a wave plate not shown. The polarization separation layer transmits one of the linearly polarized components included in the light from the wavelength conversion element without modification, and reflects the other of the linearly polarized components in a direction perpendicular to the illumination light axis 100ax. The reflecting layer reflects the other linearly polarized component, which has been reflected by the polarization separation layer, toward a direction parallel to the illumination light axis 100ax. The wave plate converts the other linearly polarized component having been reflected by the reflecting layer into the one linearly polarized component.

The superimposing lens 150 collects each of the partial light beams from the polarization conversion element 140 to superimpose the partial light beams on each other in the vicinity of the image forming area of each of the liquid crystal light valves 400R, 400G, and 400B.

The first lens array 120, the second lens array 130 and the superimposing lens 150 constitute an integrator optical system for homogenizing the in-plane light intensity distribution of the light from the wavelength conversion element 90.

The color separation light guide optical system 200 is provided with dichroic mirrors 210, 220, reflecting mirrors 230, 240 and 250, and relay lenses 260, 270. The color separation light guide optical system 200 separates the light from the illumination device 100 into the red light R, the green light G, and the blue light B, and then guides the colored light beams of the red light R, the green light G, and the blue light B to the liquid crystal light valves 400R, 400G and 400B to be the illumination objects, respectively.

Between the color separation light guide optical system 200 and the liquid crystal light valve 400R, there is disposed a field lens 300R. Between the color separation light guide optical system 200 and the liquid crystal light valve 400G, there is disposed a field lens 300G. Between the color separation light guide optical system 200 and the liquid crystal light valve 400B, there is disposed a field lens 300B.

The dichroic mirror 210 transmits the red light R component, and reflects the green light G component and the blue light B component toward the dichroic mirror 220. The dichroic mirror 220 reflects the green light G component toward the field lens 300G, and transmits the blue light B component.

The red light R having passed through the dichroic mirror 210 is reflected by the reflecting mirror 230, then passes through the field lens 300R, and then enters the image forming area of the liquid crystal light valve 400R for the red light R.

The green light G having been reflected by the dichroic mirror 210 is further reflected by the dichroic mirror 220, then passes through the field lens 300G, and then enters the image forming area of the liquid crystal light valve 400G for the green light G.

The blue light B having passed through the dichroic mirror 220 enters the image forming area of the liquid crystal light valve 400B for the blue light B via the relay lens 260, the reflecting mirror 240 on the incident side, the relay lens 270, the reflecting mirror 250 on the emission side, and the field lens 300B.

The liquid crystal light valves 400R, 400G, and 400B each modulate the light emitted from the light source device 10. These liquid crystal light valves are each for modulating the colored light beam having entered the liquid crystal light valve in accordance with image information to thereby form a color image, and each become the illumination object of the illumination device 100.

Further, although not shown in the drawings, an incident side polarization plate and an emission side polarization plate are respectively disposed on the light incident side and the light emission side of the liquid crystal light valve 400R. The same applies to the liquid crystal light valves 400G, 400B.

The cross dichroic prism 500 combines the image light emitted from the respective liquid crystal light valves 400R, 400G, and 400B with each other to form a color image. The cross dichroic prism 500 has a roughly rectangular planar shape formed of four rectangular prisms bonded to each other, and on the roughly X-shaped interfaces on which the rectangular prisms are bonded to each other, there are formed dielectric multilayer films.

The projection optical device 600 projects the color image formed by the liquid crystal light valves 400R, 400G, and 400B on a screen SCR. The projection optical device 600 is constituted by a plurality of projection lenses.

The projector 1000 according to the seventh embodiment is provided with the light source device 10 described above, and is therefore high in reliability, and at the same time, reduction of the manufacturing cost can be achieved. Further, the projector 1000 is provided with the wavelength conversion element 90, and can therefore display an image with a desired color. It should be noted that it is possible to use a phosphor for emitting fluorescence having a color other than yellow as the phosphor. For example, it is also possible to use a phosphor for emitting red fluorescence or to use a phosphor for emitting green fluorescence. It is possible to select the wavelength conversion element for emitting the fluorescence having an arbitrary color in accordance with the intended use of the projector.

It should be noted that the scope of the present disclosure is not limited to the embodiments described above, but a variety of modifications can be provided thereto within the scope or the spirit of the present disclosure.

For example, although some of the bonding sections are formed of the bonding material including the organic adhesive in the light source a device of the embodiments described above, the bonding material can be formed of a bonding material including only the organic adhesive, or can also be formed of a bonding material including a metal material or an inorganic material.

Although there is shown an example in which the light source device is provided with the sub-mounts in the embodiments described above, the light source device is not necessarily required to be provided with the sub-mount. Further, regardless of the presence or absence of the sub-mount, the emission direction of the light from the plurality of light emitting elements can be a direction perpendicular to the first surface of the substrate, or can also be a direction parallel to the first surface of the substrate. As described above, in the case in which the emission direction of the light is parallel to the first surface of the substrate, it is sufficient to fold the light path of the light from the light emitting element using a prism or the like to guide the light to the light transmissive member.

Further, the specific configurations of the shape, the size, the number, the arrangement, the material and so on of a variety of members including the substrate, the light emitting elements, the frame body, the lid body, the support member, the light transmissive member and so on constituting the light source device, and the specific descriptions related to the method of manufacturing the light source device are not limited to the embodiments described above, but can arbitrarily be modified.

Although in the embodiments described above, there is described the example of the case in which the present disclosure is applied to the transmissive projector, the present disclosure can also be applied to reflective projectors. Here, "transmissive" denotes that the liquid crystal light valve including the liquid crystal panel and so on has a configuration of transmitting the light. The term "reflective" denotes that the liquid crystal light valve has a configuration of reflecting the light. It should be noted that the light modulation device is not limited to the liquid crystal light valve, but it is also possible to use, for example, a digital micromirror device.

Although in the embodiments described above, there is cited the example of the projector using three liquid crystal panels, the present disclosure can also be applied to a projector using one liquid crystal light valve alone or a projector using four or more liquid crystal light valves.

Although in the embodiments described above, there is cited the example of the light source device provided with the transmissive wavelength conversion element, a light source device provided with a reflective wavelength conversion element can also be adopted. Further, although there is cited the example in which the light source device is provided with the wavelength conversion element, the light source device is not required to be provided with the wavelength conversion element. In such a case, it is sufficient for the light source device described above to be used for at least one of the light source device for emitting the red light, the light source device for emitting the green light, and the light source device for emitting the blue light as the light source device of the projector.

Although in the embodiments described above, there is described the example of installing the light source device according to the present disclosure in the projector, this is not a limitation. The light source device according to the present disclosure can also be applied to lighting equipment, a headlight of a vehicle, and so on.

What is claimed is:

1. A light source device comprising:
   a substrate having a first surface;
   a plurality of light emitting elements disposed on the first surface side of the substrate;
   a frame body which is disposed so as to surround the plurality of light emitting elements, and which is bonded on the first surface side of the substrate; and
   a lid body which has a light transmissive member configured to transmit light emitted from the plurality of light emitting elements, which is disposed so as to be opposed to the first surface of the substrate, which includes a support member to which the light transmissive member is bonded, and which is bonded on an opposite side of the frame body to the substrate, wherein
   the plurality of light emitting elements is housed in a housing space, the housing space being formed by the substrate, the frame body and the lid body,
   the frame body is formed of a material including a nonconductive material, and
   the support member is bonded on the opposite side of the frame body to the substrate.

2. The light source device according to claim 1, further comprising:
   an insulating layer disposed on the first surface of the substrate; and
   an interconnection layer disposed on an opposite side of the insulating layer to the substrate, wherein
   a connection terminal of the light emitting element and the interconnection layer are electrically connected to each other.

3. A projector comprising:
   the light source device according to claim 2;
   a light modulation device configured to modulate light from the light source device in accordance with image information; and
   a projection optical device configured to project the light modulated by the light modulation device.

4. A projector comprising:
   the light source device according to claim 1;
   a light modulation device configured to modulate light from the light source device in accordance with image information; and
   a projection optical device configured to project the light modulated by the light modulation device.

5. A light source device comprising:
   a substrate having a first surface;

a plurality of light emitting elements disposed on the first surface side of the substrate;

a frame body which is disposed so as to surround the plurality of light emitting elements, and which is bonded on the first surface side of the substrate;

a lid body which has a light transmissive member configured to transmit light emitted from the plurality of light emitting elements, which is disposed so as to be opposed to the first surface of the substrate, and which is bonded on an opposite side of the frame body to the substrate;

an insulating layer disposed on the first surface of the substrate; and an interconnection layer disposed on an opposite side of the insulating layer to the substrate, wherein the plurality of light emitting elements is housed in a housing space, the housing space being formed by the substrate, the frame body and the lid body, the frame body is formed of a material including resin, and the light emitting element and the interconnection layer each includes a connection terminal that are electrically connected.

6. The light source device according to claim 5, wherein the lid body further includes a support member to which the light transmissive member is bonded, and the support member is bonded on the opposite side of the frame body to the substrate.

7. The light source device according to claim 6, further comprising:

a gas barrier layer disposed on a side surface of the frame body.

8. The light source device according to claim 7, further comprising:

a light reflecting layer disposed on the side surface of the frame body facing the housing space.

9. A projector comprising:

the light source device according to claim 8;

a light modulation device configured to modulate light from the light source device in accordance with image information; and a projection optical device configured to project the light modulated by the light modulation device.

10. A projector comprising:

the light source device according to claim 7;

a light modulation device configured to modulate light from the light source device in accordance with image information; and a projection optical device configured to project the light modulated by the light modulation device.

11. A projector comprising:

the light source device according to claim 6;

a light modulation device configured to modulate light from the light source device in accordance with image information; and a projection optical device configured to project the light modulated by the light modulation device.

12. The light source device according to claim 5, further comprising:

a gas barrier layer disposed on a side surface of the frame body.

13. The light source device according to claim 12, further comprising:

a light reflecting layer disposed on the side surface of the frame body facing the housing space.

14. A projector comprising:

the light source device according to claim 13;

a light modulation device configured to modulate light from the light source device in accordance with image information; and a projection optical device configured to project the light modulated by the light modulation device.

15. A projector comprising:

the light source device according to claim 12;

a light modulation device configured to modulate light from the light source device in accordance with image information; and a projection optical device configured to project the light modulated by the light modulation device.

16. A projector comprising:

the light source device according to claim 5;

a light modulation device configured to modulate light from the light source device in accordance with image information; and a projection optical device configured to project the light modulated by the light modulation device.

17. A method of manufacturing a light source device, the method comprising:

providing the light source device with a substrate having a first surface, a plurality of light emitting elements disposed on the first surface side of the substrate, a frame body which is disposed so as to surround the plurality of light emitting elements, and which is bonded on the first surface side of the substrate, a lid body which has a light transmissive member configured to transmit light emitted from the plurality of light emitting elements, which is disposed so as to be opposed to the first surface of the substrate, and which is bonded on an opposite side of the frame body to the substrate, an insulating layer disposed on the first surface of the substrate, and an interconnection layer disposed on an opposite side of the insulating layer to the substrate; and performing at least one of bonding of the substrate and the frame body and bonding of the frame body and the lid body by welding.

* * * * *